United States Patent [19]
Honda

[11] Patent Number: 5,592,013
[45] Date of Patent: Jan. 7, 1997

[54] SEMICONDUCTOR DEVICE AND METHOD OF FABRICATING THE SAME

[75] Inventor: Hiroki Honda, Hyogo, Japan

[73] Assignee: Mitsubishi Denki Kabushiki Kaisha, Tokyo, Japan

[21] Appl. No.: 467,649

[22] Filed: Jun. 6, 1995

[30] Foreign Application Priority Data

Oct. 12, 1994 [JP] Japan ................................ 6-246167

[51] Int. Cl.$^6$ ................................. H01L 29/76
[52] U.S. Cl. .................... 257/392; 257/393; 257/903; 257/904
[58] Field of Search .................... 257/392, 393, 257/903, 904

[56] References Cited

U.S. PATENT DOCUMENTS

| | | | |
|---|---|---|---|
| 4,472,871 | 9/1984 | Green et al. | 257/392 |
| 4,525,811 | 6/1985 | Masuoka | 257/903 |
| 5,020,029 | 5/1991 | Ichinose et al. | 257/903 |
| 5,455,438 | 10/1995 | Hashimoto et al. | 257/393 |

FOREIGN PATENT DOCUMENTS

| | | |
|---|---|---|
| 55-48971 | 4/1980 | Japan . |
| 58-130560 | 8/1983 | Japan . |
| 61-258392 | 11/1986 | Japan . |
| 58-6586 | 4/1987 | Japan . |
| 58-6584 | 4/1987 | Japan . |
| 3-83289 | 4/1991 | Japan . |

OTHER PUBLICATIONS

Evert Seevinck et al., Static–Noise Margin Analysis of MOS SRAM Cells, pp. 748–754, IEEE Journal of Solid–State Circuits, vol. SC–22, No. 5, Oct. 1987.
H. Shinohara et al, Parasitic Resistance Effects on Static MOS RAM, pp. 106 and 107, VLSI 1982.

*Primary Examiner*—Mark V. Prenty
*Attorney, Agent, or Firm*—Lowe, Price, LeBlanc & Becker

[57] ABSTRACT

In a semiconductor memory device, an n-well is formed in the memory cell area on the surface of a p-type semiconductor substrate. A p-well is formed on the surface of the n-well, and a memory cell transistor is formed on the surface of the p-well. Another p-well is formed in the peripheral circuit area on the substrate surface, and a peripheral transistor is formed on the surface of the p-well. The p-wells are connected electrically by a conductor layer so that these regions have the same voltage level. The memory cell transistor has its threshold voltage set higher than that of the peripheral transistor. The memory device consumes less power, has less decay of gate oxide film, and is suitable for high-density integration.

5 Claims, 26 Drawing Sheets

CROSS SECTION ALONG LINE 12-12

CROSS SECTION OF PERIPHERAL CIRCUIT

CROSS SECTION ALONG LINE 12-12

CROSS SECTION OF PERIPHERAL CIRCUIT

SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly to a semiconductor memory device of the type of static random access memory (SRAM) and a method of fabricating the same.

2. Description of the Prior Art

There has been known SRAM as a type of semiconductor memory device. The SRAM is advantageous in that it does not need the refreshing operation and retains data stably.

FIG. 34 shows the equivalent circuit of a typical SRAM-type memory cell having a high-resistance load. This memory cell consists of a pair of driver transistors Q1 and Q2, a pair of access transistors Q3 and Q4, and a pair of high-resistance load resistors R1 and R2. The load resistors R1 and R2 have their one ends connected to the power source Vcc and their other ends connected to memory nodes N1 and N2, respectively.

The driver transistors and access transistors Q1–Q4 are MOS (Metal Oxide Semiconductor) transistors. The driver transistors Q1 and Q2 have their source regions connected to the ground (GND) voltage, their drain regions connected to the memory nodes N1 and N2, respectively, and their gate electrodes connected to the memory nodes N2 and N1, respectively.

The access transistor Q3 has its one of two source/drain regions connected to the memory node N1 and its other source/drain region connected to a bit line. Similarly, the access transistor Q4 has its one of two source/drain regions connected to the memory node N2 and its other source/drain region connected to another bit line. The access transistors Q3 and Q4 have their gate electrodes connected to a word line.

In regard to SRAM-type semiconductor memory devices, such as the one mentioned above, Japanese patent publication JP-A-3-83289 discloses a semiconductor structure in which MOS transistors of a memory cell (will be termed "memory transistor" hereinafter) have their threshold voltage set higher than that of MOS transistors of a peripheral circuit (will be termed "peripheral transistor" hereinafter).

Referring to FIG. 35 showing the cross section of the semiconductor memory device disclosed in the above-mentioned patent publication, in a memory cell area on the major surface of a p-type semiconductor substrate 501, there is formed an n-well 503. There is further formed a p-well 505 within the area of the n-well 503 on the major substrate surface. On the surface of the p-well 505, an n-MOS transistor 510 having a pair of n-type source/drain regions 511 and a gate electrode layer 515 is formed.

In a peripheral circuit area on the major surface of the p-type semiconductor substrate 501, there is formed a p-well 507. On the surface of the p-well 507, an n-MOS transistor 530 having a pair of n-type source/drain regions 531 and a gate electrode layer 535 is formed.

The p-well 505 of the memory cell area has the application of a source-well reverse bias voltage provided by a substrate bias voltage generation circuit 545. Based on this reverse bias voltage application, in the semiconductor memory device of the above-mentioned patent publication, the memory transistor 510 has its threshold voltage set higher than that of the peripheral transistor 530 so that the memory cell drive current is smaller and the peripheral circuit provides a larger drive current.

Consequently, the normal data retention in memory cells is ensured and the operation of peripheral circuits including the input/output buffer, decoder and word driver is sped up.

The semiconductor memory device shown in FIG. 35 is fabricated conventionally in the sequential steps of process as shown in the cross-sectional diagrams of FIG. 36 through FIG. 40.

Referring to FIG. 36, in a peripheral circuit area on a p-type semiconductor substrate 501, a resist pattern 551a is formed based on the usual photolithographic process. By using the resist pattern 551a as a mask, n-type impurity such as phosphor (P) is doped to form an n-type region 503a in the memory cell area. The resist pattern 551a is removed thereafter.

Referring to FIG. 37, the n-type region 503a is diffused into the substrate 501 based on the heat treatment, and an n-well 503 is formed in the memory cell area.

Referring to FIG. 38, a resist pattern 551b is formed based on the photolithographic process. By using the resist pattern 551b as a mask, p-type impurity such as boron (B) is doped selectively to form p-type regions 505a and 507a where a memory transistor and peripheral transistor will be formed, respectively. The resist pattern 551b is removed thereafter.

Referring to FIG. 39, the p-type regions 505a and 507a are diffused based on the heat treatment, and a p-well 505 is formed in the n-well 503 and another p-well 507 is formed in the peripheral circuit area.

Referring to FIG. 40, a device separation insulating layer 541 is formed based on the usual LOCOS (Local Oxidation of Silicon) process or the like. Silicon oxide films 514 which will become gate oxide films are formed based on the heat treatment or the like. P-type impurity such as boron for determining the threshold voltage is doped to the entire surface.

After that, the transistors and the bias voltage generation circuit are formed to complete the semiconductor memory device shown in FIG. 35.

The conventional semiconductor memory device uses the bias voltage generation circuit 545 for making the threshold voltage different between the memory transistor 510 and peripheral transistor 530, and this circuit takes an extra area on the chip. As a result, the chip size increases, making the device unsuitable for high-density integration, the device cost rises, and the power consumption increases due to the provision of the bias voltage generation circuit 545.

In addition, the power voltage added by the absolute value of the substrate bias voltage is applied to the gate oxide film of the memory transistor 510, e.g., for a power voltage of 5 V and a substrate bias voltage of −3 V, a total of 8 V is applied to the gate oxide film. The higher application voltage to the gate oxide film adversely affects its life time. The decay of gate oxide film is more pronounced for lower power voltage ratings. Specifically, with the substrate bias voltage of −3 V being applied, when the power voltage is 5 V, the gate oxide film has the application of 8 V, as mentioned above, which is 1.6 times the power voltage. If the power voltage is 3 V, the gate oxide film has the application of 6 V, which is twice the power voltage.

Accordingly, the conventional semiconductor memory device is deficient in that it is not suitable for high-density integration, it consumes much power, and its gate oxide film decays quickly.

In addition, the conventional fabrication method of semiconductor memory device is deficient in that it includes intricate steps of process for forming the substrate bias voltage generation circuit.

SUMMARY OF THE INVENTION

An object of the present invention is to provide a semiconductor memory device which consumes less power, decays less in its gate oxide film, and is suitable for high-density integration.

Another object of the present invention is to provide a simplified fabrication method of the above-mentioned semiconductor memory device.

A semiconductor memory device according to one aspect of this invention has a memory cell area including static-type memory cells and a peripheral circuit area, and it includes a semiconductor substrate of a first conductivity type, a first impurity region of a second conductivity type, a second impurity region of the first conductivity type, first MIS (Metal Insulator Semiconductor) transistors, a third impurity region of the first conductivity type, and second MIS transistors.

The first impurity region is formed within the memory cell area at the major surface of the semiconductor substrate. The second impurity region is formed within the first impurity region at the major substrate surface, and it includes impurity of the first conductivity type at a first concentration at a position near the major substrate surface. The first MIS transistor has a pair of source/drain regions which are formed by being spaced out from each other by a prescribed distance within the second impurity region at the major substrate surface, and a gate electrode layer which is formed by being interposed with a gate insulating layer over the area between the two source/drain regions. The third impurity region is formed within the peripheral circuit area on the major substrate surface, and it includes impurity of the first conductivity type at a second concentration, which is lower than the first concentration, at a position near the major substrate surface. The second MIS transistor has a pair of source/drain regions which are formed by being spaced out from each other by a prescribed distance within the third impurity region at the major substrate surface, and a gate electrode layer which is formed by being interposed with a gate insulating layer over the area between the two source/drain regions. The second and third impurity regions are connected electrically.

In this semiconductor memory device, the second impurity region has its impurity concentration near the substrate surface set lower than that of the third impurity region. Accordingly, the first MIS transistors which constitute a memory cell has a higher threshold voltage than the second MIS transistors in the peripheral circuit area. Consequently, it is not necessary to provide a bias voltage generation circuit to make the threshold voltage different between these transistors, which is the case of the conventional memory cell structure, and the chip size is reduced and the power consumption is also reduced.

Because of the absence of the bias voltage generation circuit, the second and third impurity regions can have the same voltage level by being connected electrically, and only the power voltage is applied to the gate insulating layer of the first MIS transistors of memory cell. The lower voltage application to the gate insulating layer of the first MIS transistors suppresses the decay of the gate insulating layer significantly.

A semiconductor memory device according to another aspect of this invention includes a semiconductor substrate having a major surface. Each of the driver transistors, access transistors and MIS transistors has a pair of source/drain regions formed by being spaced out from each other by a prescribed distance on the major substrate surface. The impurity of the first conductivity type of the area between the two source/drain regions of the driver transistor has a concentration of $2.4\times10^{16}\text{cm}^{-3}$ or more near the major substrate surface. The impurity of the first conductivity type of the area between the two source/drain regions of the access transistor has a concentration of $1.8\times10^{16}\text{cm}^{-3}$ or more and below $2.4\times10^{16}\text{cm}^{-3}$ near the major substrate surface. The impurity of the first conductivity type of the area between the two source/drain regions of the MIS transistor has a concentration below $1.8\times10^{16}\text{cm}^{-3}$ near the major substrate surface A semiconductor memory device according to still another aspect of this invention is designed such that the driver transistor has a higher threshold voltage than that of the access transistor, and the threshold voltage of the access transistor is higher than that of the MIS transistor in the peripheral circuit area. Owing to the higher threshold voltage of the driver transistor than that of the access transistor, the SRAM-type memory cell retains data more stably and the occurrence of soft error is prevented. Owing to the higher threshold voltage of the access transistor than that of the MIS transistor in the peripheral circuit area, the SRAM-type memory cell reads out data more stably and operates faster.

A method of fabricating the semiconductor device based on this invention is to fabricate a semiconductor memory structure having a memory cell area including static-type memory cells and a peripheral circuit area, and the method comprises the following steps of process.

On a semiconductor substrate of a first conductivity type, impurity of a second conductivity type is doped by using a mask of resist pattern formed on the peripheral circuit area, and a first impurity region of the second conductivity type is formed within the memory cell area on the major substrate surface. With the resist pattern being left in use as a mask, impurity of the first conductivity type is doped in the memory cell area on the major substrate surface. Subsequently, impurity of the first conductivity type is doped selectively in the first impurity region and the peripheral circuit area, and a second and third impurity regions of the first conductivity type are formed in the first impurity region and in the peripheral circuit area, respectively, on the major substrate surface. First MIS transistors are formed at the surface of the second impurity region, and second MIS transistors are formed at the surface of the third impurity region. A conductor layer is formed to connect the second and third impurity regions.

In this method, the steps of forming the first impurity region in the memory cell area and doping impurity for determining the threshold voltage of transistor are carried out by using the same mask of resist pattern. Consequently, it is possible to set different threshold voltages for the transistors of the memory cell area and peripheral circuit area without increasing the number of steps of photolithographic process relative to the conventional method.

Moreover, by eliminating the steps of forming the bias voltage generation circuit in the conventional method, the fabrication process is simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be explained with reference to the drawings.

Embodiment 1

The structure of an SRAM-type memory cell having a high-resistance load based on the first embodiment of this invention will be explained.

Figure 1:
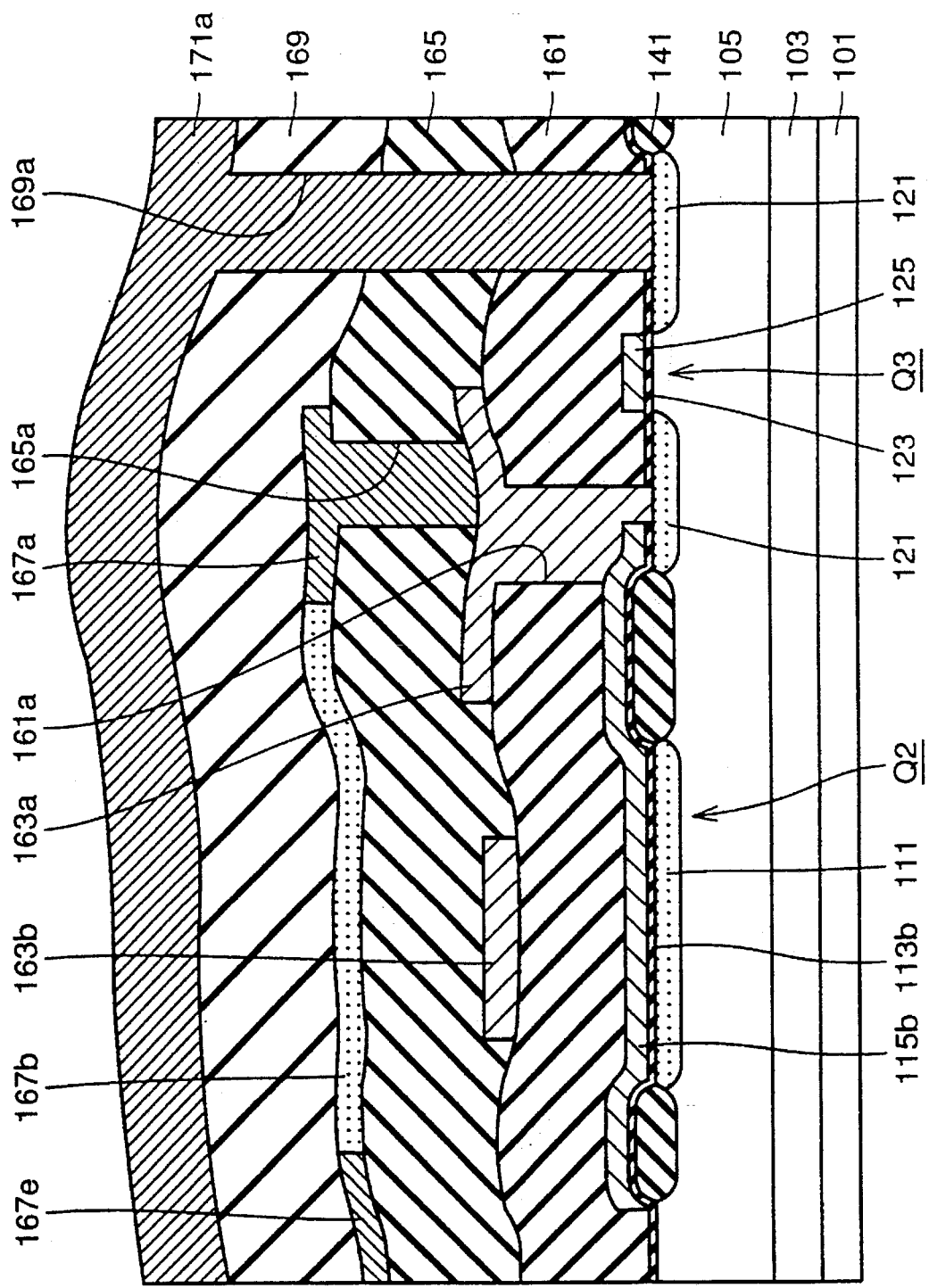
FIG. 1 is a cross-sectional diagram showing briefly the memory cell structure based on the first embodiment of this invention.

FIG. 1 is a cross-sectional view of a memory cell taken along the line 1—1 of FIG. 2–FIG. 5.

Figure 2:
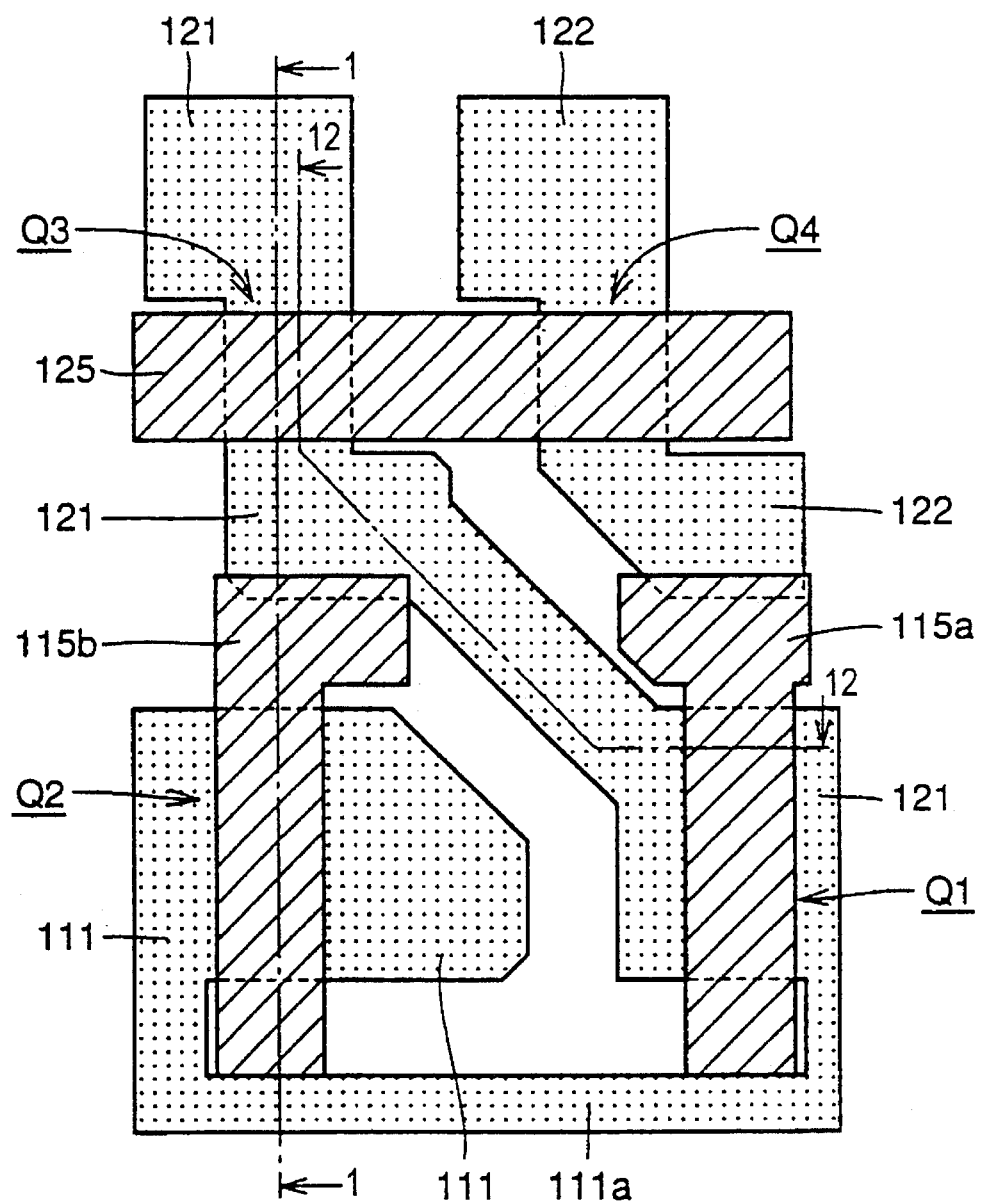
FIG. 2 through FIG. 5 are plane views showing four layers of the memory cell structure in ascending order from the bottom based on the first embodiment of this invention.
Figure 3:
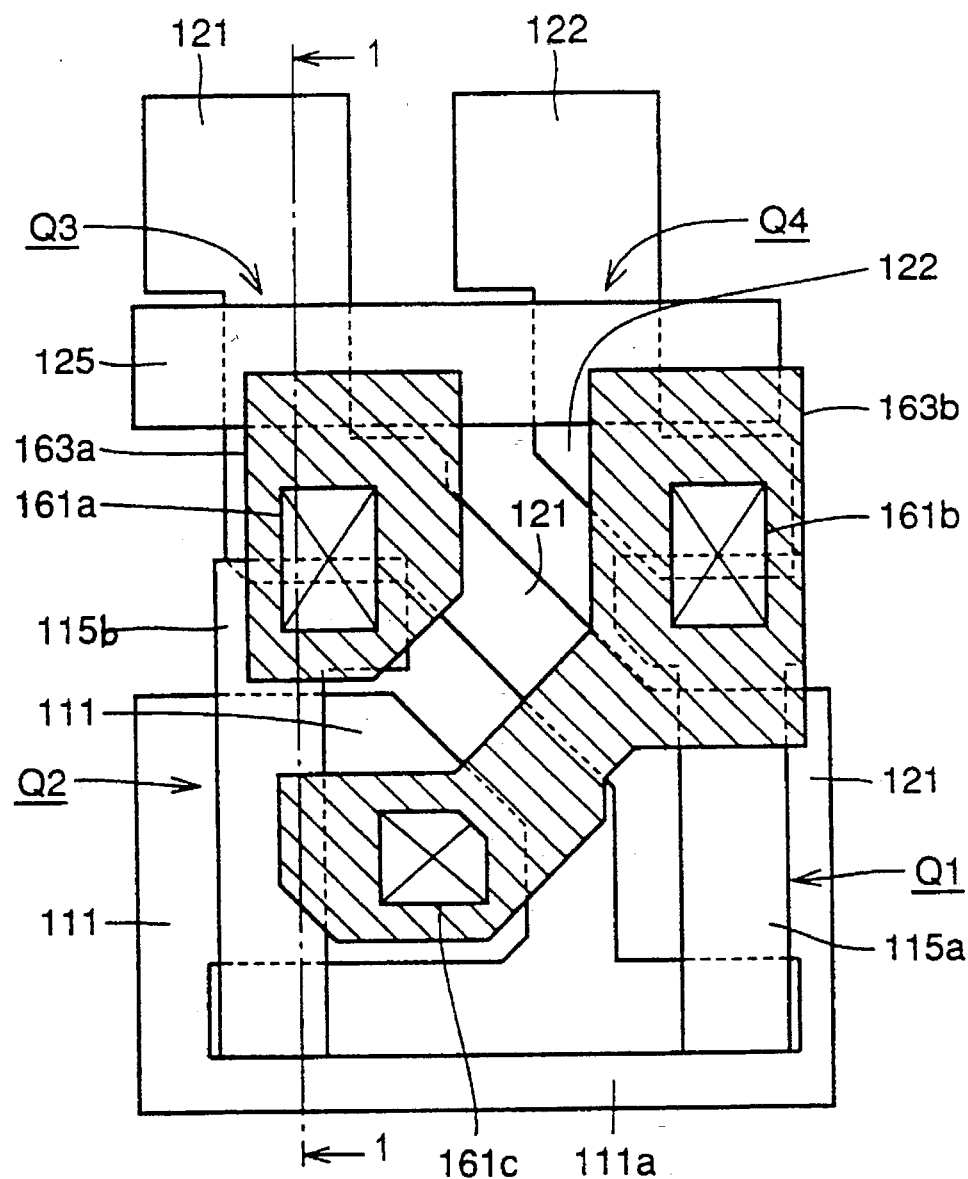
Figure 4:
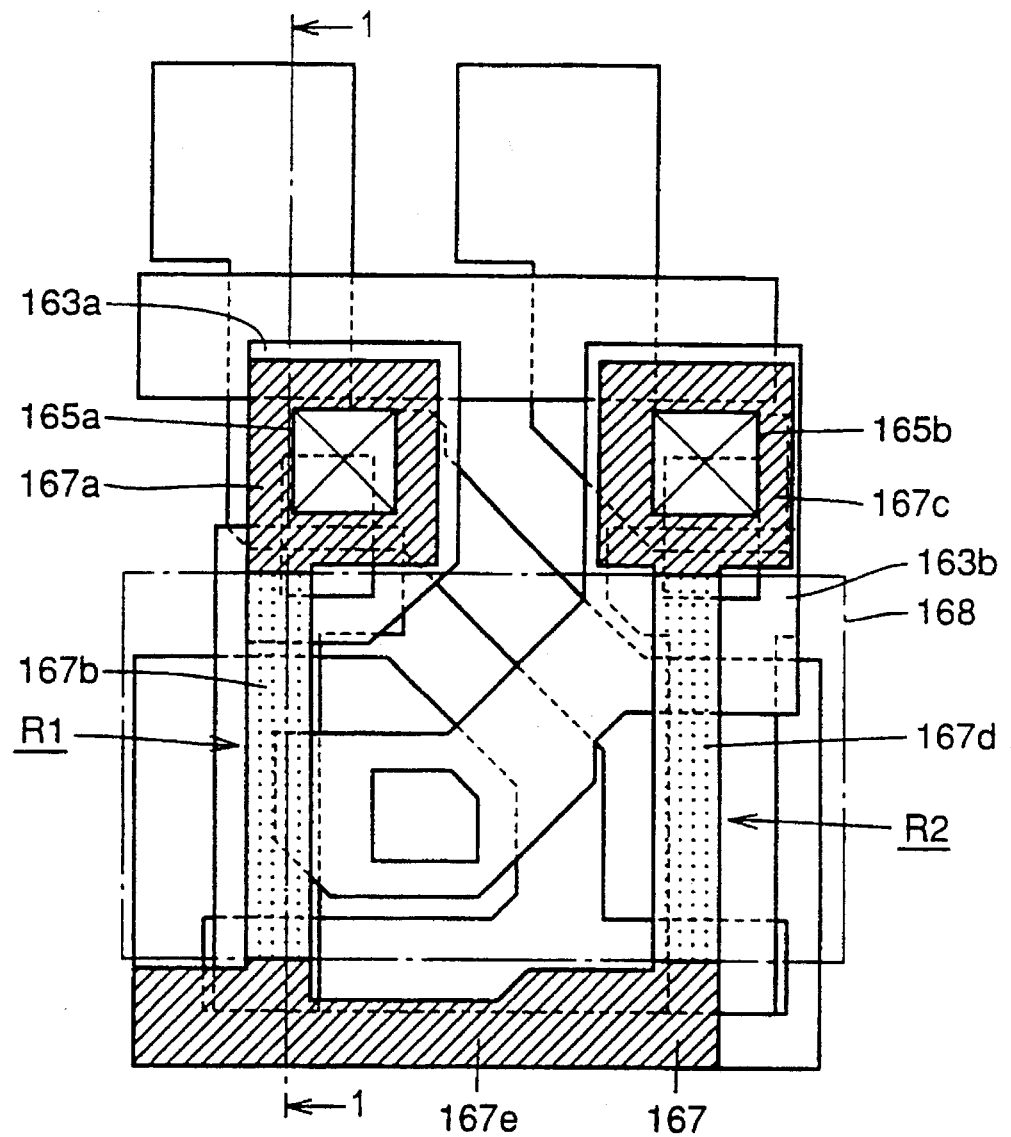
Figure 5:
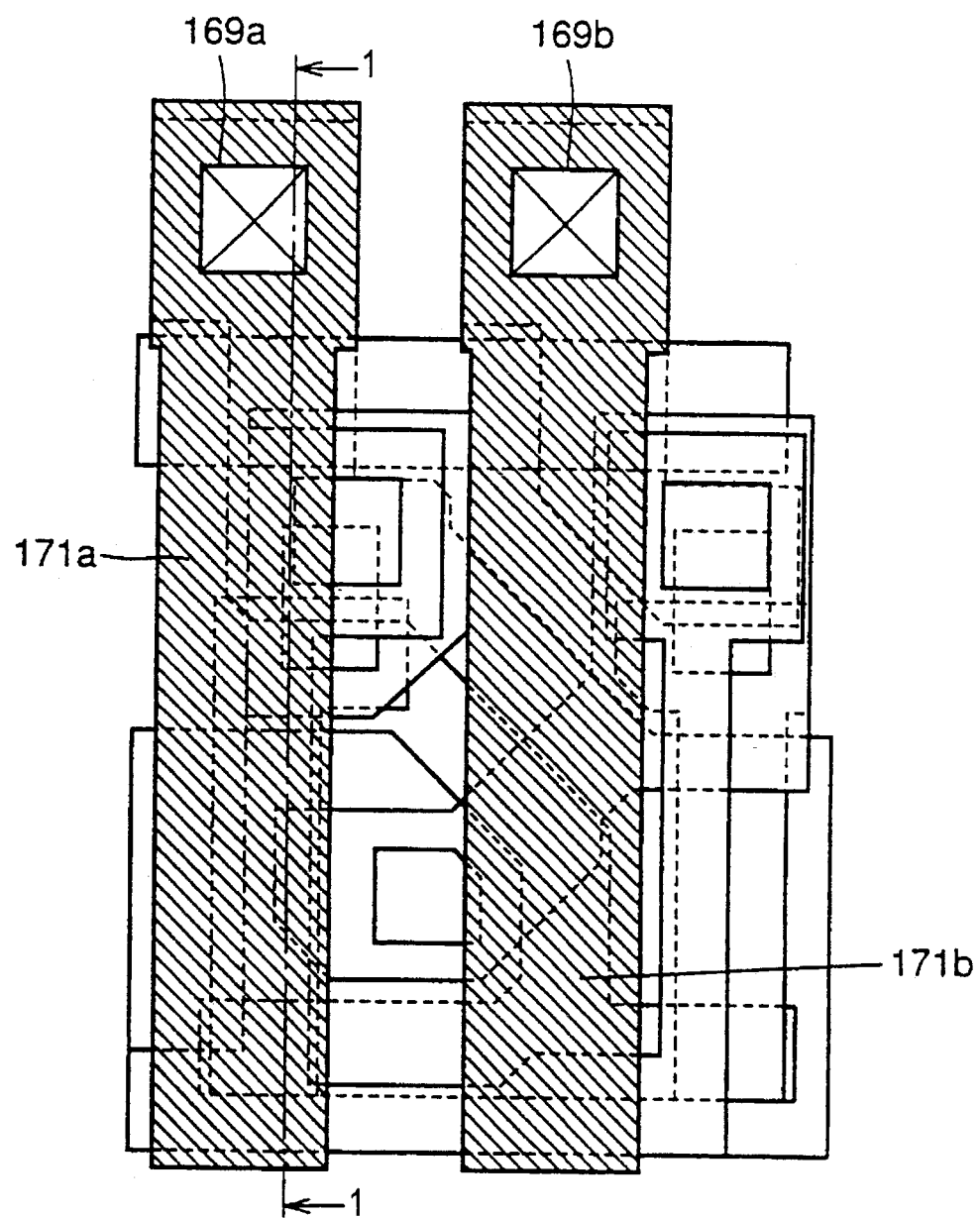

FIG. 2 and FIG. 3 show the structure of a pair of driver transistors Q1 and Q2 and a pair of access transistors Q3 and Q4 formed at the substrate. FIG. 4 shows the structure of a pair of high-resistance resistors R1 and R2, and FIG. 5 shows the structure of bit lines.

Referring to FIG. 1 and FIG. 2, an n-well 103 and a p-well 105 are formed on a p-type silicon substrate 101. A pair of driver transistors Q1 and Q2 and a pair of access transistors Q3 and Q4 are formed at the surface of the p-well 105 by being separated by a separation insulating layer 141.

The driver transistor Q1 has a pair of source/drain regions 121, a gate insulating layer (not shown) and a gate electrode layer 115a. A pair of source/drain regions 121 formed of n-type diffusion regions are located by being spaced out from each other to define a channel region. The gate electrode layer 115a is formed to confront the channel region by being interposed with the gate insulating layer.

The driver transistor Q2 has a pair of source/drain regions 111, a gate insulating layer 113b and a gate electrode layer 115b. A pair of source/drain regions 111 formed of n-type diffusion regions are located by being spaced out from each other to define a channel region. The gate electrode layer 115b is located to confront the channel region by being interposed with the gate insulating layer 113b.

The access transistor Q3 has a pair of source/drain regions 121, a gate insulating layer 123 and a gate electrode layer 125. A pair of source/drain regions 121 formed of n-type diffusion regions are located by being spaced out from each other to define a channel region. The gate electrode layer 125 is located to confront the channel region by being interposed with the gate insulating layer 123.

The access transistor Q4 has a pair of source/drain regions 122, a gate insulating layer (not shown) and the gate electrode layer 125. A pair of source/drain regions 122 formed of n-type diffusion regions are located by being spaced out from each other to define a channel region. The gate electrode layer 125 is located to confront the channel region by being interposed with the gate insulating layer.

The access transistors Q3 and Q4 have their gate electrode layer 125 formed of a single conductor layer, which serves as a word line.

The drain region 121 of the driver transistor Q1 and one source/drain region of the access transistor Q3 are formed of a single n-type diffusion region.

The source regions 121 and 111 of the driver transistors Q1 and Q2 are connected by an n-type diffusion region 111a, and these regions are formed of a single n-type diffusion region.

The gate electrode layers 115a and 115b of the driver transistors Q1 and Q2 and the gate electrode layer 125 of the access transistors Q3 and Q4 are conductor layers derived from the same layer formed of polycrystalline silicon doped with impurity (will be termed simply "doped poly-silicon" hereinafter), for example. Portions outside the n-type diffusion regions and channel regions are covered by the formation of a separation oxide film 141.

Referring to FIG. 1 and FIG. 3, an insulating layer 161 is formed to cover the gate electrode layers 115a, 115b and 125. The insulating layer 161 has the formation of contact holes 161a, 161b and 161c. A first doped poly-silicon layer 163a is formed by being connected electrically with the n-type diffusion region 121 and gate electrode layer 115b through the contact hole 161a. Similarly, a second doped poly-silicon layer 163b is formed by being connected with the n-type diffusion region 122 and gate electrode layer 115a through the contact hole 161b and connected with the n-type diffusion region 111 through the contact hole 161c.

Referring to FIG. 1 and FIG. 4, an insulating layer 165 is formed to cover the first and second doped poly-silicon layers 163a and 163b. The insulating layer 165 has the openings 165a and 165b. A resistor layer 167 of polycrystalline silicon is formed by being connected electrically with the first doped poly-silicon layer 163a through the opening 165a and connected with the second doped poly-silicon layer 163b through the opening 165b.

The resistor layer 167 includes areas doped with impurity (will be termed "doped regions") 167a, 167c and 167e, and areas without doped impurity (will be termed "undoped regions") 167b and 167d. The doped region 167a and 167c are located where the resistor layer 167 is in contact with the first and second doped poly-silicon layers 163a and 163b through the openings 165a and 165b. The undoped regions 167b and 167d extend in the same direction from the doped regions 167a and 167c, respectively. The undoped regions 167b and 167d having a large resistance value constitute the resistors R1 and R2, and have their ends connected to the doped region 167e which serves as a Vcc wiring of the memory cell.

Referring to FIG. 1 and FIG. 5, an insulating layer 169 is formed to cover the resistor layer 167. The insulating layer 169 has the formation of contact holes 169a and 169b. A pair of aluminum wiring layers 171a and 171b are formed by being in contact electrically with the n-type diffusion regions 121 and 122 through the contact holes 169a and 169b, respectively.

Next, the memory cell area and peripheral circuit area of the foregoing memory cell structure will be explained.

Figure 6:
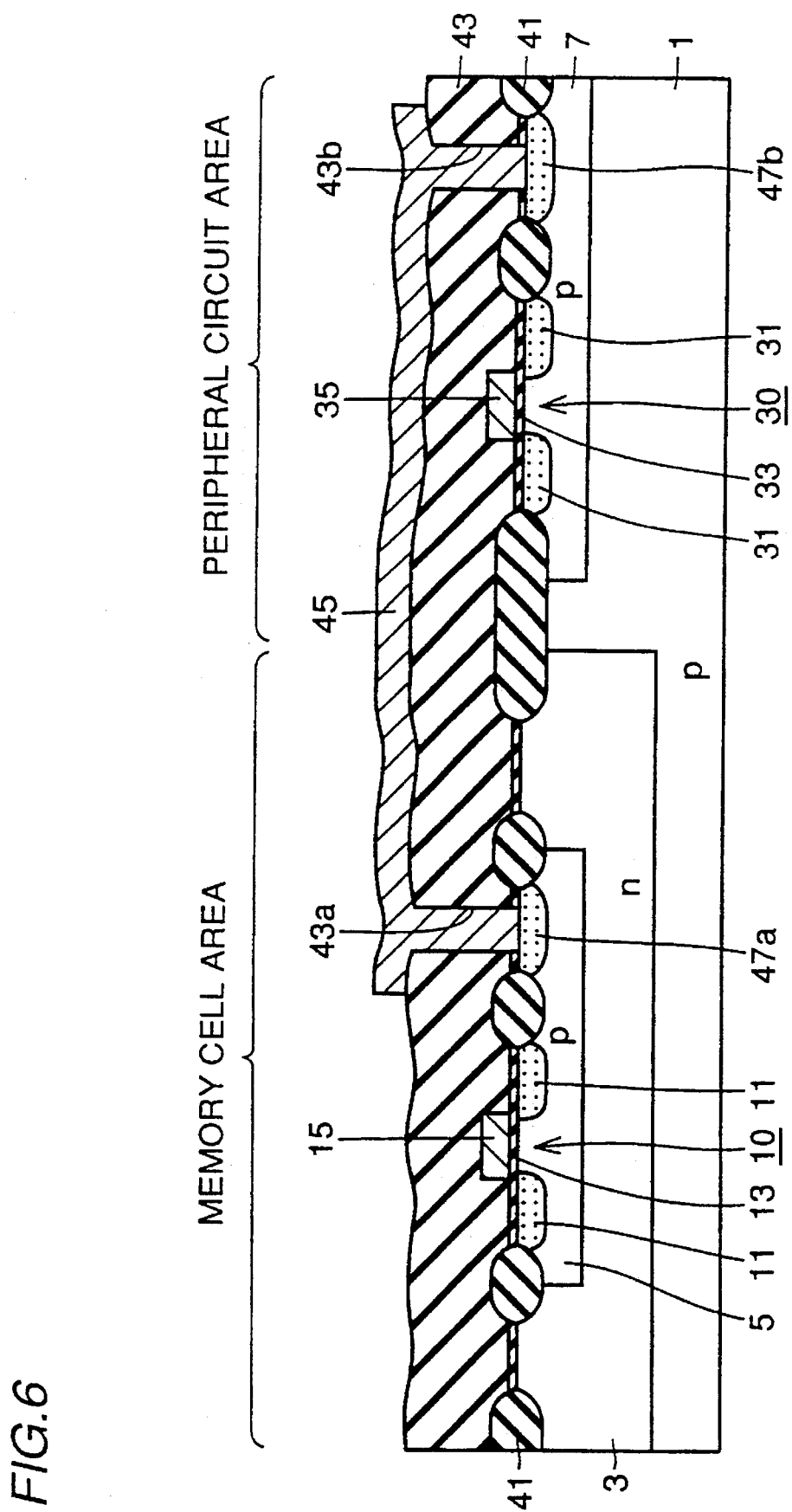
FIG. 6 is a cross-sectional diagram showing briefly the structure of the semiconductor memory device based on the first embodiment of this invention.

Referring to FIG. 6, in the memory cell area on the p-type semiconductor substrate 1, there is formed an n-well 3. The provision of the n-well 3 is required for the prevention of soft error when a p-type semiconductor substrate is used. A p-well 5 is formed at part of the surface of the n-well 3, and a memory transistor 10 is formed at the surface in an area of the p-well 5 isolated by a separation insulating layer 41.

The memory transistor 10 is an nMOS transistor having a pair of source/drain regions 11, a gate insulating layer 13 and a gate electrode layer 15. A pair of source/drain regions 11 are formed by being spaced out from each other by a prescribed distance, and the gate electrode layer 15 is formed on the area between a pair of source/drain regions 11 by being interposed with the gate insulating layer 13.

In the peripheral circuit area, p-well 7 is formed at the surface of the p-type semiconductor. A peripheral transistor 30 is formed at the surface of the p-well 7.

The peripheral transistor 30 is an nMOS transistor having a pair of source/drain regions 31, a gate insulating layer 33 and a gate electrode layer 35. A pair of source/drain regions 31 are formed by being spaced out from each other by a prescribed distance, and the gate electrode layer 35 is formed on the area between the source/drain regions 31 by being interposed with the gate insulating layer 33.

An insulating layer 43 is formed to cover the transistors 10 and 30. The insulating layer 43 has the formation of contact holes 43a and 43b which reach the p-wells 5 and 7, respectively. A conductor layer 45 of aluminum, for example, is formed to connect the p-wells 5 and 7 by way of the contact holes 43a and 43b. Accordingly the p-wells 5 and 7 have the same voltage level.

The channel region of the memory transistor 10 has its impurity concentration set higher than the impurity concentration of the peripheral transistor 30, and consequently the memory transistor 10 has a higher threshold voltage than that of the peripheral transistor 30. At portions of the conductor layer 45 in contact with the p-wells 5 and 7, there are formed p+-type diffusion regions 47a and 47b.

Next, the method of fabricating a semiconductor memory device having different impurity concentrations for the channel regions of the memory transistor and peripheral transistor will be explained.

Figure 7:
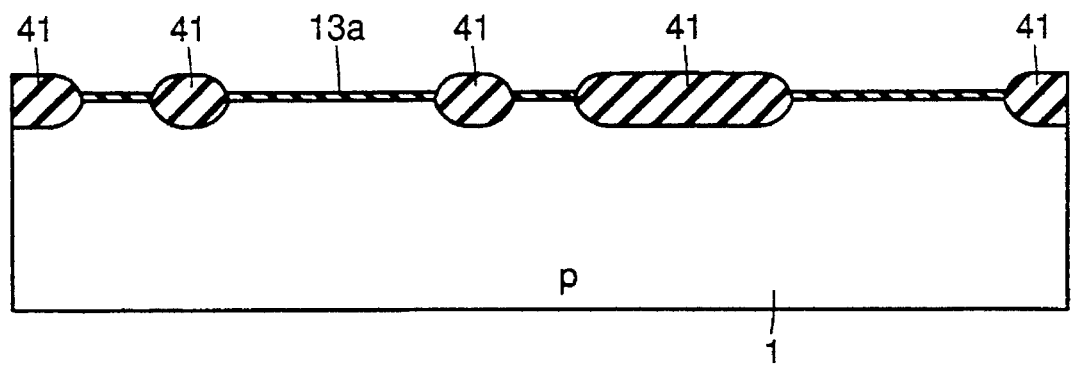
FIG. 7 through FIG. 10 are cross-sectional diagrams showing briefly the sequential steps of the fabrication method of semiconductor memory device based on the first embodiment of this invention.

Referring to FIG. 7, on a p-type semiconductor substrate 1, a separation insulating layer 41 is formed in intended surface portions based on the usual LOCOS process or the like. Subsequently, a silicon oxide film 13a which will become a gate oxide film is formed on the surface of the substrate 1.

Figure 8:
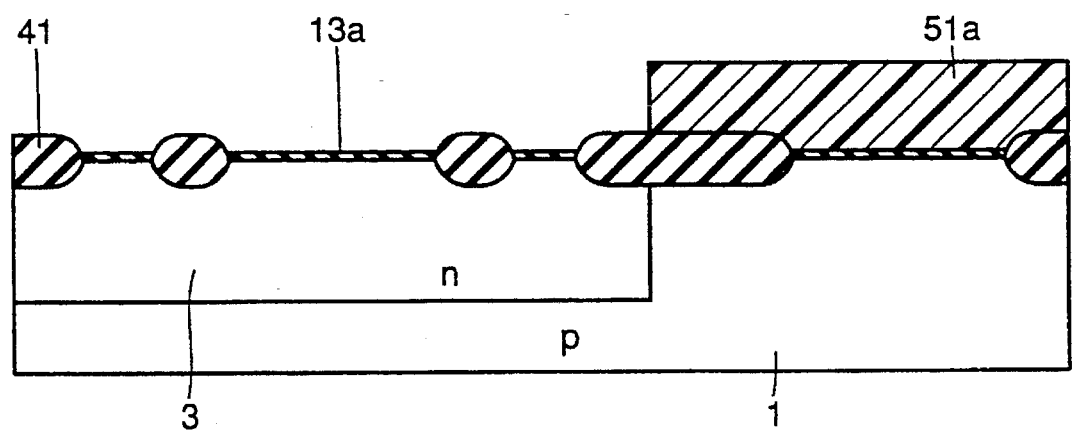

Referring to FIG. 8, a resist pattern 51a is formed in the peripheral circuit area based on the photolithographic process. By using the resist pattern 51a as a mask, n-type impurity such as phosphorus is doped in the memory cell area to form an n-well 3. By using the same mask of resist pattern 51a, p-type impurity such as boron is doped in the n-well 3, and the resist pattern 51a is removed thereafter.

Figure 9:
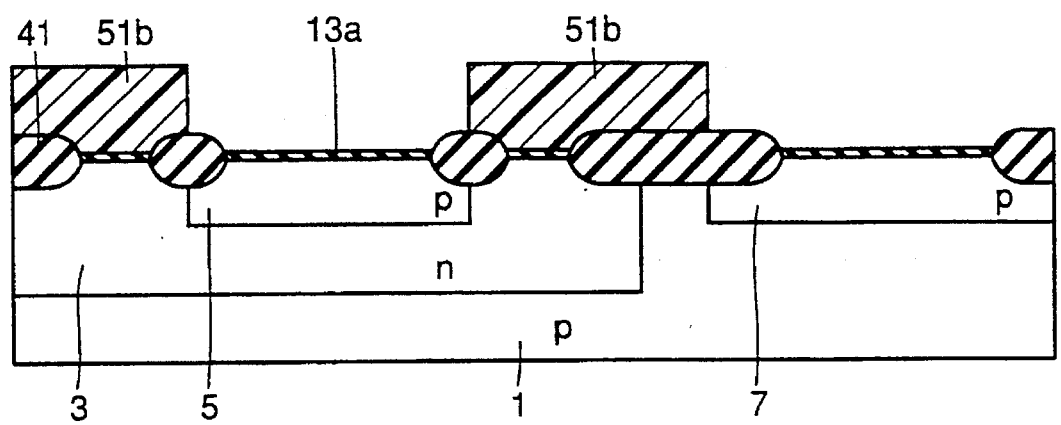

Referring to FIG. 9, a resist pattern 51b is formed in intended portions of the substrate based on the photolithographic process. By using the resist pattern 51b as a mask, p-type impurity such as boron is doped selectively in the memory cell area and peripheral circuit area. Consequently, p-wells 5 and 7 are formed at the surface of the n-well 3 and peripheral circuit area, respectively. By using the same mask of resist pattern 51b, p-type impurity such as boron is doped in the wells 5 and 7, and the resist patterns 51b are removed thereafter.

Figure 10:
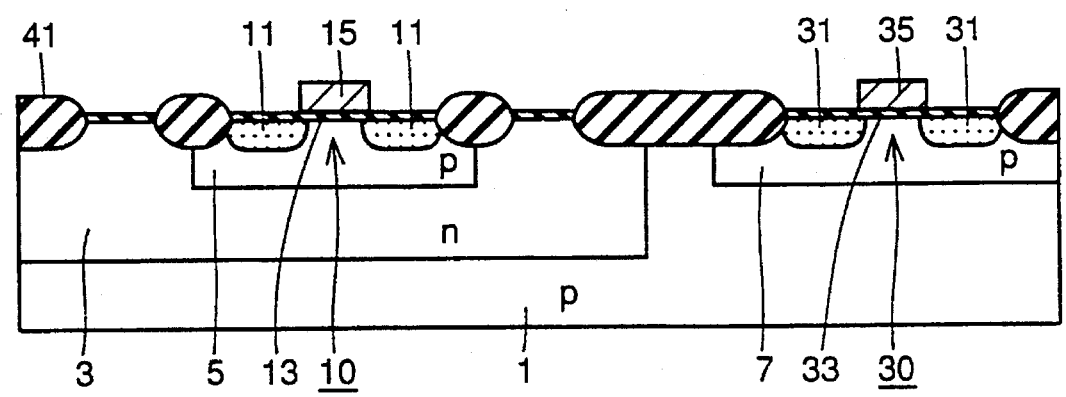

Referring to FIG. 10, gate electrode layers 15 and 35 of intended shapes are formed based on the conventional method. Subsequently, pairs of source/drain regions 11 and 31 are formed on both sides of the gate electrode layers 15 and 35, and the memory transistor 10 and peripheral transistor 30 are completed.

A conductor layer (shown in FIG. 6) is formed to connect the p-wells 5 and 7 electrically. The conductor layer 45 and p+-type diffusion regions 47a and 47b of FIG. 6 are not shown in FIG. 7 through FIG. 10 however.

In the semiconductor memory device of this embodiment shown in FIG. 6, the impurity concentration for the channel region of the memory transistor 10 is set higher than the impurity concentration for the counterpart of the peripheral transistor 30, and consequently the memory transistor 10 has a higher threshold voltage than that of the peripheral transistor 30. Namely, these transistors can have different threshold voltages without the provision of the bias voltage generation circuit 545 used in the conventional semiconductor memory device. Consequently the chip size is reduced and the power consumption of the device is also reduced.

Since substrate bias generating circuit 545 becomes unnecessary, current is not consumed in substrate bias generating circuit 545. Therefore, current consumption can also be reduced.

Because of the absence of the bias voltage generation circuit 545, the p-wells 5 and 7 of the memory cell area and peripheral circuit area can have the same voltage level by being connected electrically, and only the power voltage is applied to the gate insulating layer 13 of the memory transistor 10. The lower voltage application to the gate insulating layer 13 of the memory transistor 10 suppresses the decay of the gate insulating layer significantly. This matter will be explained in more detail.

Figure 11:
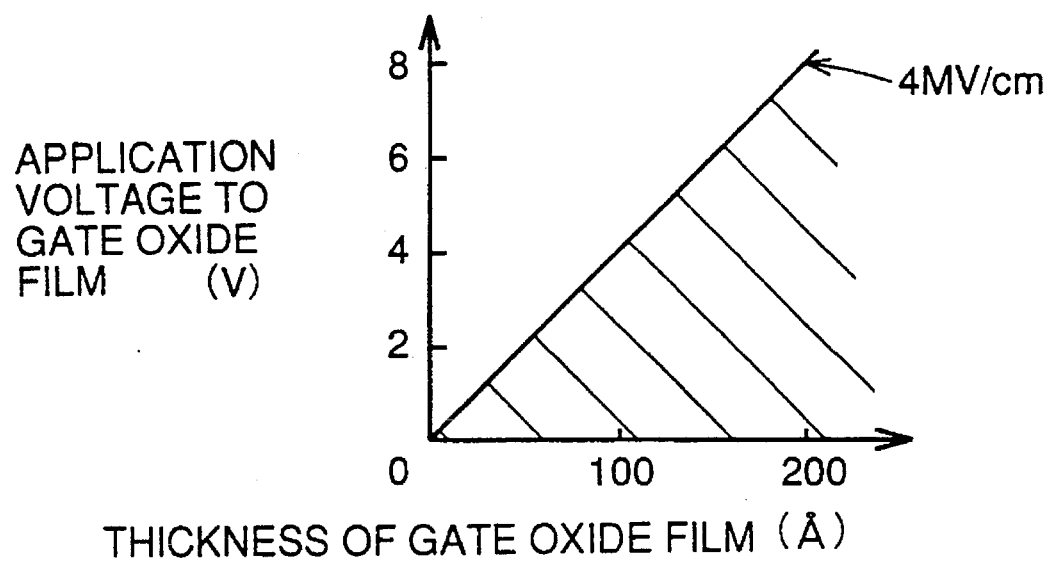
FIG. 11 is a graph showing the relationship between the thickness of the gate oxide film and the application voltage to the film.

Generally, the electric field strength applicable to the gate oxide film of $SiO_2$ is 4 MV/cm at maximum from the viewpoint of reliability. On the graph of FIG. 11 which relates the application voltage to gate oxide film on the vertical axis to the thickness of film on the horizontal axis at the maximum field strength 4 MV/cm, the hatched portion is the safe zone in terms of the reliability of the gate oxide film.

Figure 35:
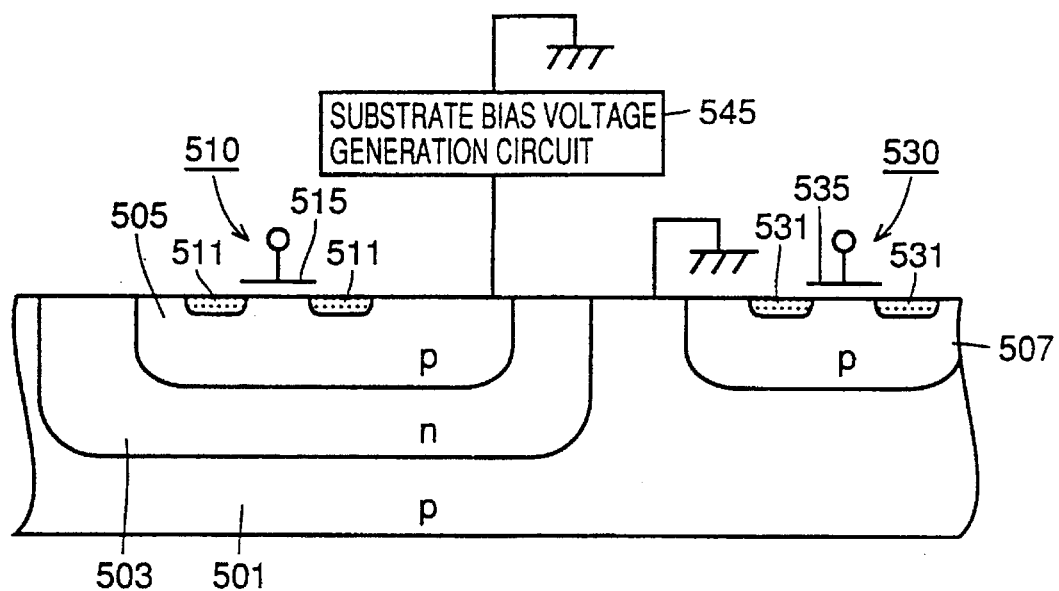
FIG. 35 is a cross-sectional diagram showing briefly the structure of the conventional semiconductor memory device.
Figure 36:
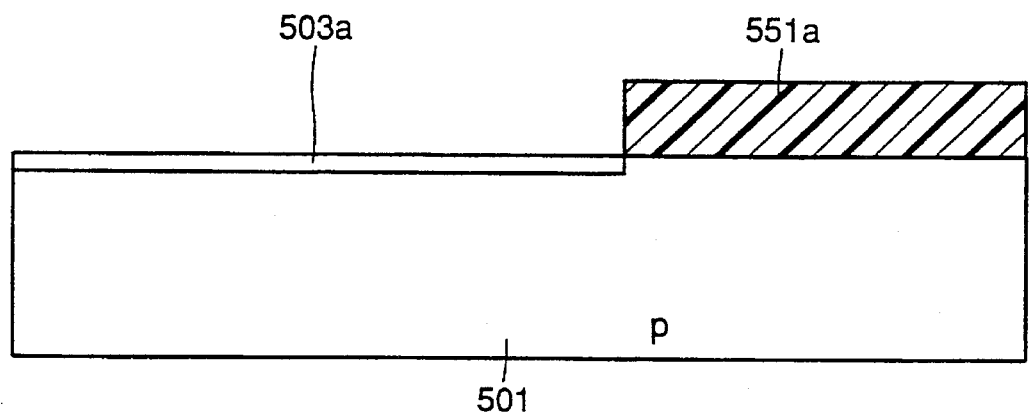
FIG. 36 through FIG. 40 are cross-sectional diagrams showing briefly the sequential steps of the conventional fabrication method of semiconductor memory device.
Figure 37:
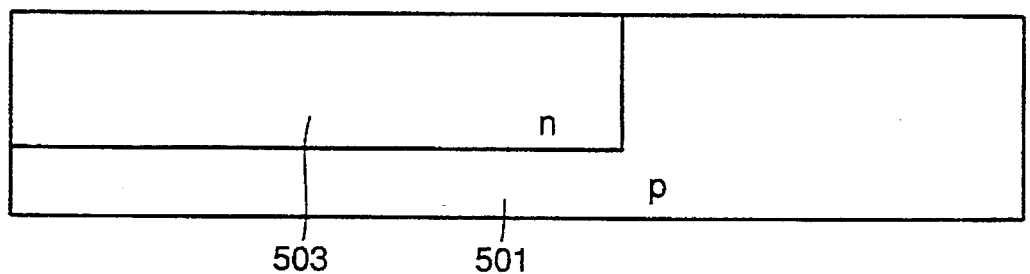
Figure 38:
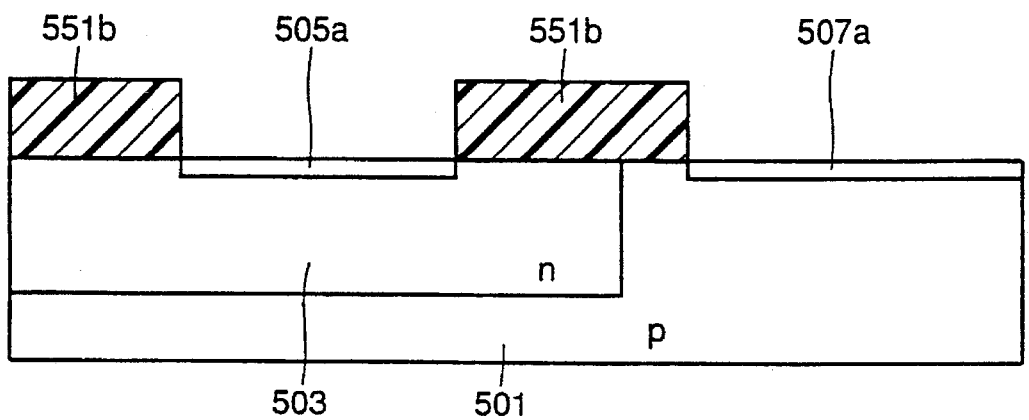
Figure 39:
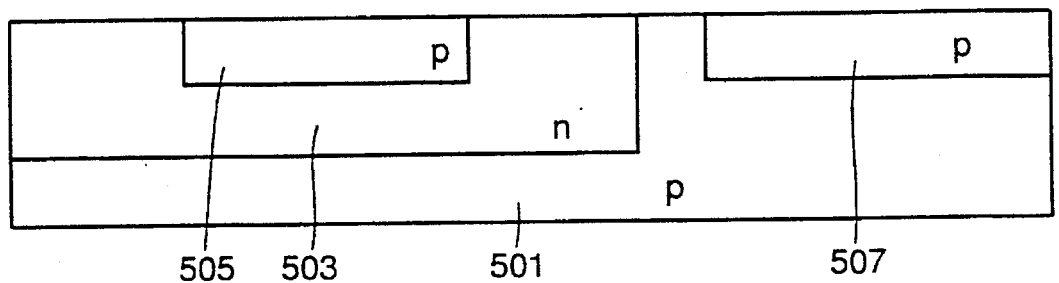
Figure 40:
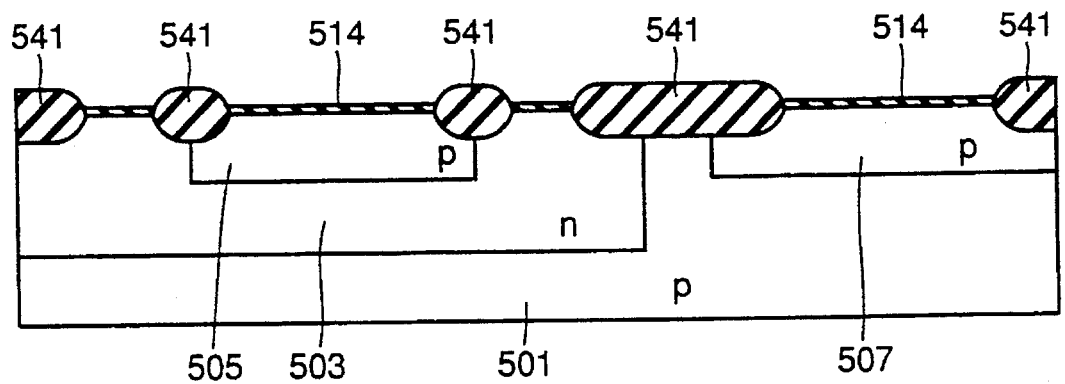

This graph reveals that when a bias voltage of −3 V is applied to the p-well 505 of the memory cell area of the conventional memory cell structure shown in FIG. 35, the minimum thickness necessary for the gate oxide film for power voltage ratings of 5 V and 3 V is as follows.

TABLE 1

| Power Voltage | Application Voltage to Gate Oxide Film | Minimum Thickness of Gate Oxide Film |
| --- | --- | --- |
| 5 V | 8 V | 200Å |
| 3 V | 6 V | 150Å |

Whereas, this embodiment shown in FIG. 6 does not need any bias voltage application to the p-well 5 of the memory cell area 5 besides the power voltage, and the graph gives the minimum thickness of gate oxide film as follows.

TABLE 2

| Power Voltage | Application Voltage to Gate Oxide Film | Minimum Thickness of Gate Oxide Film |
| --- | --- | --- |
| 5 V | 5 V | 125Å |
| 3 V | 3 V | 75Å |

Namely, the conventional memory cell structure needs to have an increased thickness of gate oxide film against the increased application voltage inclusive of the substrate bias voltage in order to ensure the reliability. Whereas, the semiconductor memory device of this embodiment can have a smaller thickness of gate oxide film relative to the conventional counterpart owing to the same voltage level of the p-wells 5 and 7 of the memory cell area and peripheral circuit area. In the case of an equal thickness of gate oxide film provided for the conventional and inventive memory cell structures, the semiconductor memory device of this embodiment of invention can be more reliable than the conventional one.

For ensuring the same reliability for the conventional and inventive semiconductor memory devices, the gate oxide film of this embodiment of invention can be made thinner than the conventional one.

In the method of fabricating a semiconductor memory device based on this embodiment, the steps of process shown in FIG. 8 of forming the n-well region 3 and doping impurity for determining the threshold voltage are carried out by using the same mask of resist pattern 51a. Furthermore, the steps of process shown in FIG. 9 of forming selectively the p-wells 5 and 7 in the memory cell area and peripheral circuit area and doping impurity for determining the threshold voltage are carried out by using the same mask of resist pattern 51b. Consequently, it is possible to set different threshold voltages for the memory transistor 10 and peripheral transistor 30 without increasing the number of steps of photolithographic process relative to the conventional method shown in FIG. 36 through FIG. 40.

Moreover, the steps of forming the bias voltage generation circuit in the conventional method are eliminated, and the fabrication process is simplified.

Although the foregoing embodiment solely deals with the threshold voltages of the memory transistor and peripheral transistor, the threshold voltage may be set differently for the driver transistor and access transistor of memory cell in addition, as will be explained in the following embodiment.

Embodiment 2

Figure 12:
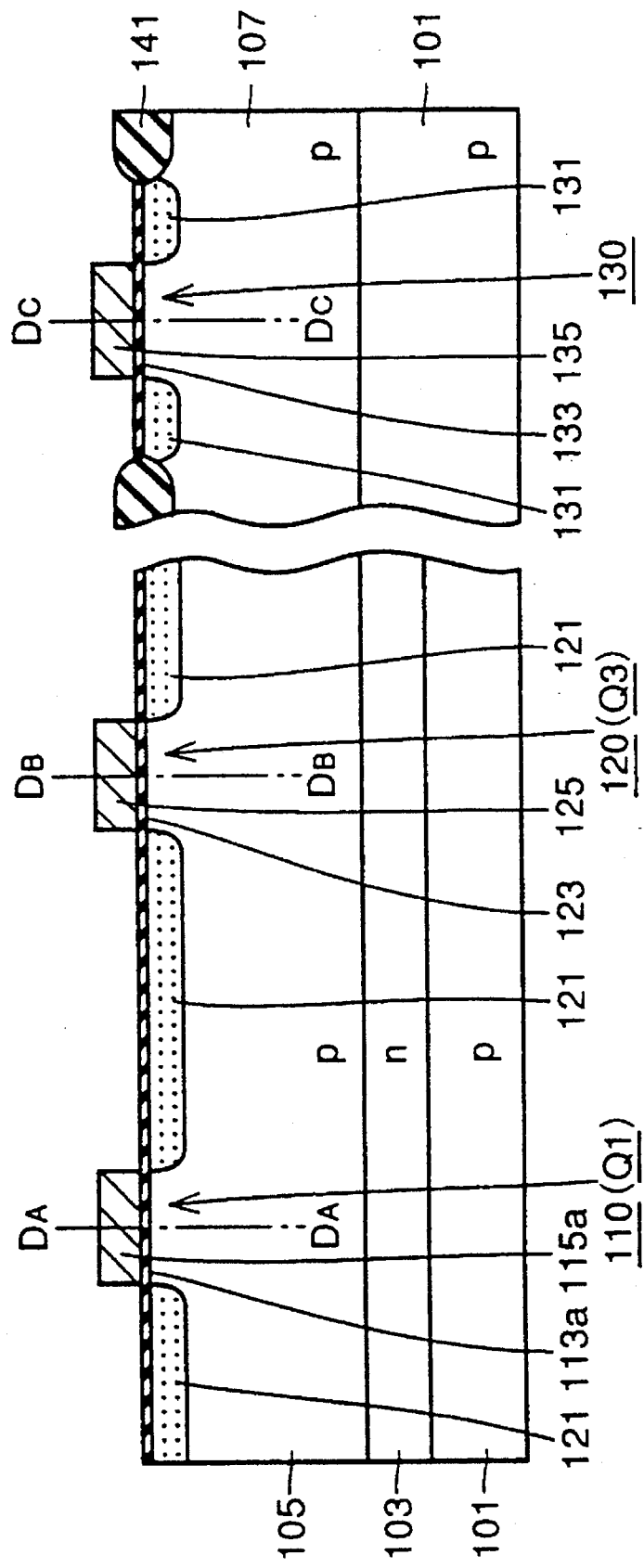
FIG. 12 is a cross-sectional view taken along the line 12—12 of FIG. 2, showing briefly the structure of the semiconductor memory device based on the second embodiment of this invention.

Referring to FIG. 12 showing the memory cell structure based on the second embodiment of this invention, a driver transistor 110 has its threshold voltage set higher than that of an access transistor 120, and the threshold voltage of the access transistor 120 is set higher than that of a peripheral transistor 130.

In the memory cell area, n-well 103 is formed at the surface of a p-type semiconductor substrate 101. At the surface of the n-well 103, there is formed a p-well 105. The driver transistor 110 and access transistor 120 are formed at the surface of the p-well 105.

These transistors 110 and 120 have the same structure as those of the first embodiment.

In the peripheral circuit area, a p-well 107 is formed at the surface of the p-type semiconductor substrate 101. The peripheral transistor 130 is formed at a surface area of the p-well 107 separated by a device separation insulating layer 141.

The peripheral transistor 130 is an nMOS transistor having a pair of source/drain regions 131, a gate insulating layer 133 and a gate electrode layer 135. A pair of source/drain regions 131 are formed by being spaced out from each other by a prescribed distance, and the gate electrode layer 135 is formed on the area between the source/drain regions 131 by being interposed with the gate insulating layer 133.

The p-wells 105 and 107 of the memory cell area and peripheral circuit area have the same voltage level by being connected by a conductor layer for example.

Figure 13:
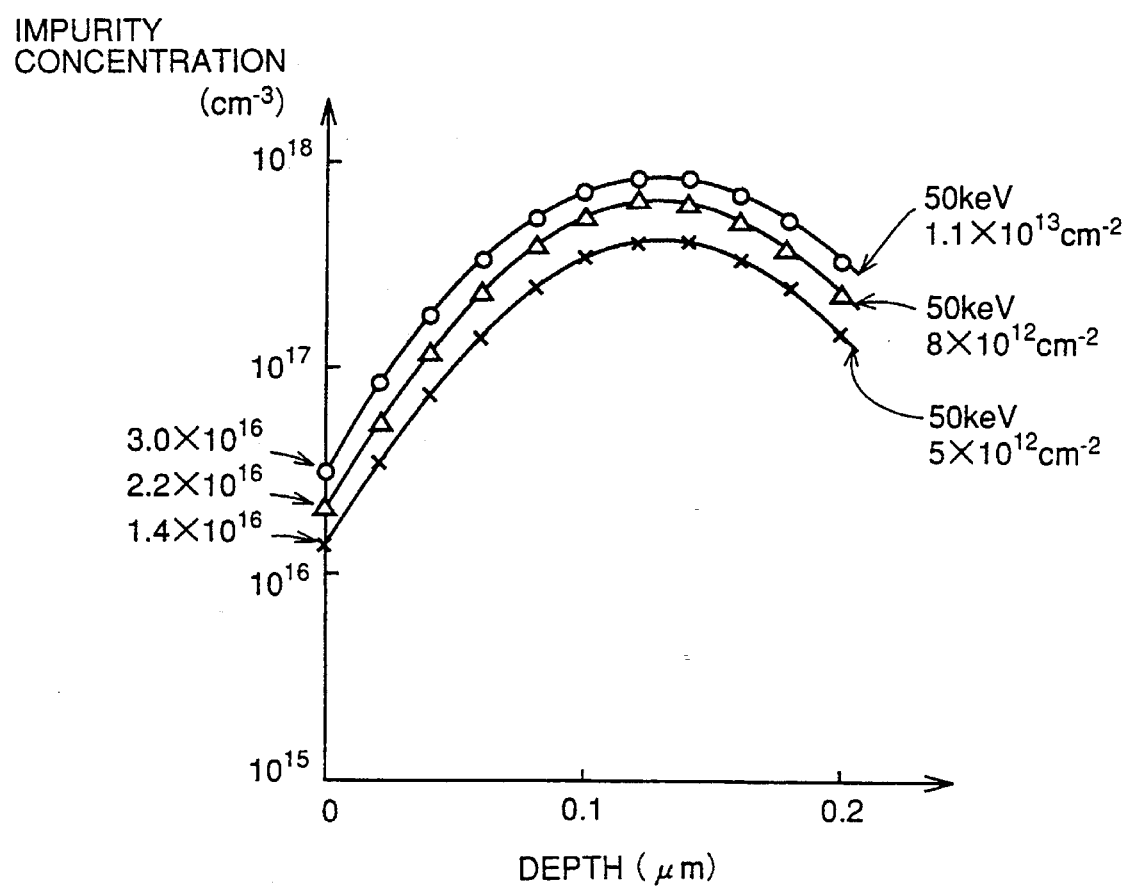
FIG. 13 is a graph showing the impurity concentration in the depth direction along the lines $D_A$–$D_A$, $D_B$–$D_B$ and $D_{C-DC}$ of FIG. 12 in the channel region of the transistor.

In FIG. 13 showing impurity concentration curves in the depth direction, plotted by mark "○" is along the line $D_A$—$D_A$, plotted by mark "△" is along the line $D_b$—$D_B$, and plotted by mark "×" is along the line $D_C$—$D_c$ of FIG. 12.

Referring to FIG. 12 and FIG. 13, the channel region of the driver transistor 110 has a p-type impurity concentration near the substrate surface (will be termed "surface concentration") of $3.0 \times 10^{16} cm^{-3}$. The access transistor 120 has a surface concentration of p-type impurity of $2.2 \times 10^{16} cm^{-3}$. The peripheral transistor 130 has a surface concentration of p-type impurity of $1.4 \times 10^{16} cm^{-3}$.

Based on the settings of the different surface concentrations of impurity for the channel regions of the transistors 110, 120 and 130, these transistors have different threshold voltages. Specifically, with their gate oxide films having an equal thickness of 10 nm, the driver transistor 110, access transistor 120 and peripheral transistor 130 have threshold voltages of 0.8 V, 0.6 V and 0.4 V, respectively, for the above-mentioned settings of impurity concentration.

Next, the method of fabricating the semiconductor substrate based on this embodiment will be explained.

Figure 14:
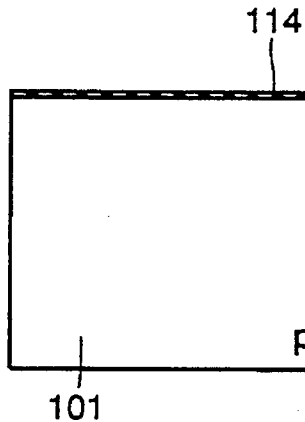
FIG. 14 through FIG. 19 are cross-sectional diagram showing briefly the sequential steps of the fabrication method of semiconductor memory device based on the second embodiment of this invention.
Figure 14:
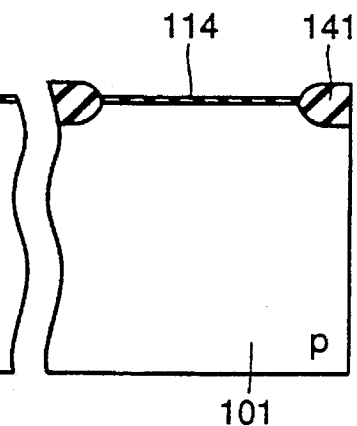

Referring to FIG. 14, on a p-type semiconductor substrate 101, a separation insulating layer 141 is formed in intended surface portions based on the usual LOCOS process or the like. Subsequently, a silicon oxide film 114 which will become gate oxide films are formed at a thickness of 10 nm for example, on the surface of the p-type semiconductor 101.

Figure 15:
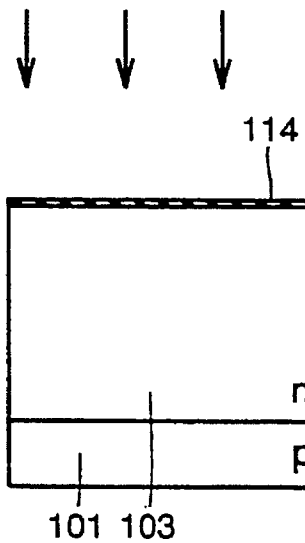
Figure 15:
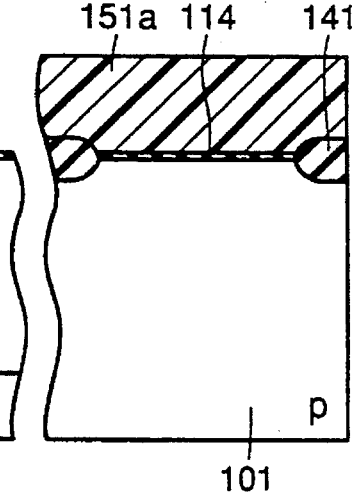

Referring to FIG. 15, a resist pattern 151a is formed in the peripheral circuit area based on the photolithographic process. By using the resist pattern 151a as a mask, n-type impurity such as phosphor is doped in the memory cell area to form an n-well 103.

Figure 16:
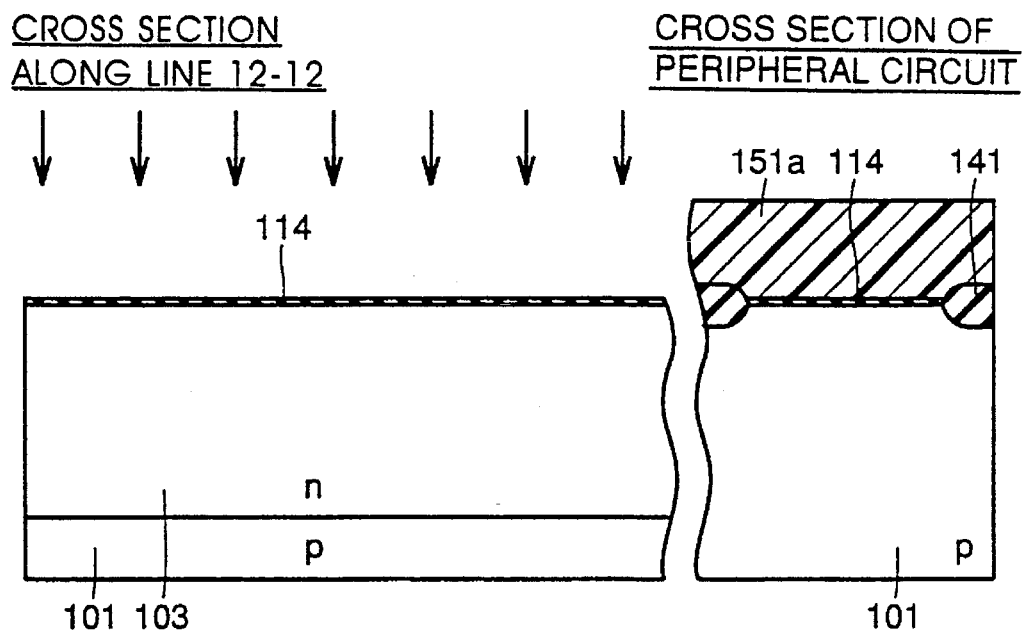

Referring to FIG. 16, with the mask of resist pattern 151a being left in use, p-type impurity such as boron is doped in the n-well 103 for a dose of $3.0 \times 10^{12} cm^{-2}$ at doping energy of 50 keV. The resist pattern 151a is removed thereafter.

Figure 17:
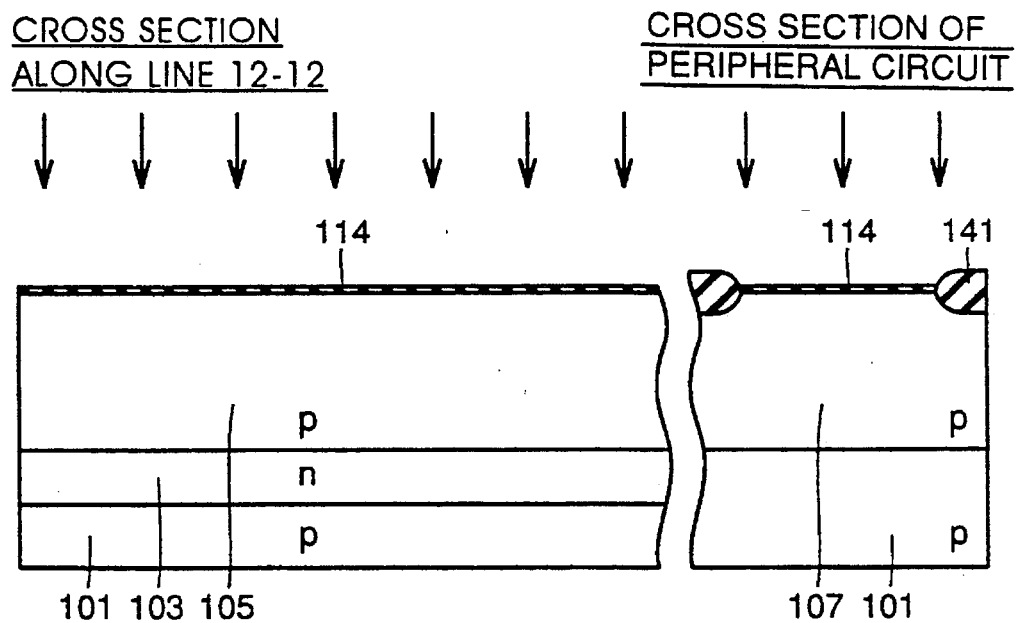

Referring to FIG. 17, p-type impurity such as boron is doped to the surface of the p-type substrate 101, and p-wells 105 and 107 are formed in the memory cell area and peripheral circuit area, respectively. Subsequently, impurity such as boron is doped in the p-wells 105 and 107 for a dose of $5.0 \times 10^{12} cm^{-2}$ at 50 keV.

Figure 18:
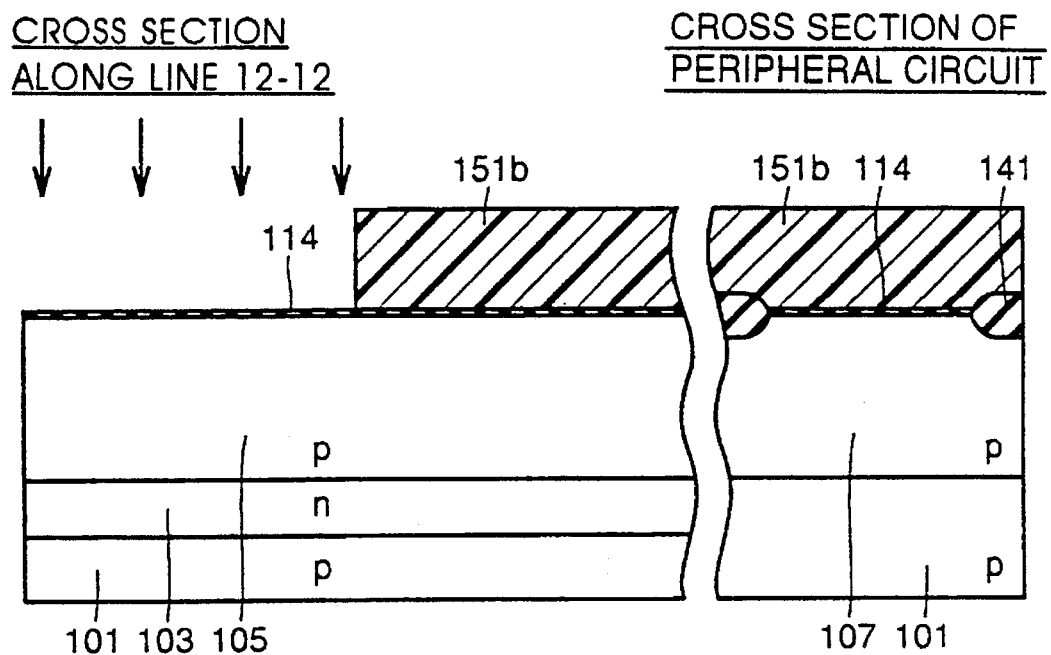

Referring to FIG. 18, on the area where the access transistor will be formed and the peripheral circuit area, a resist pattern 151b is formed based on the usual photolithographic process. By using the resist pattern 151b as a mask, p-type impurity such as boron is doped for a dose of $3.0 – 10^{12} cm^{-2}$ at 50 keV in the area where the driver transistor will be formed. The resist pattern 151b is removed thereafter.

Figure 19:
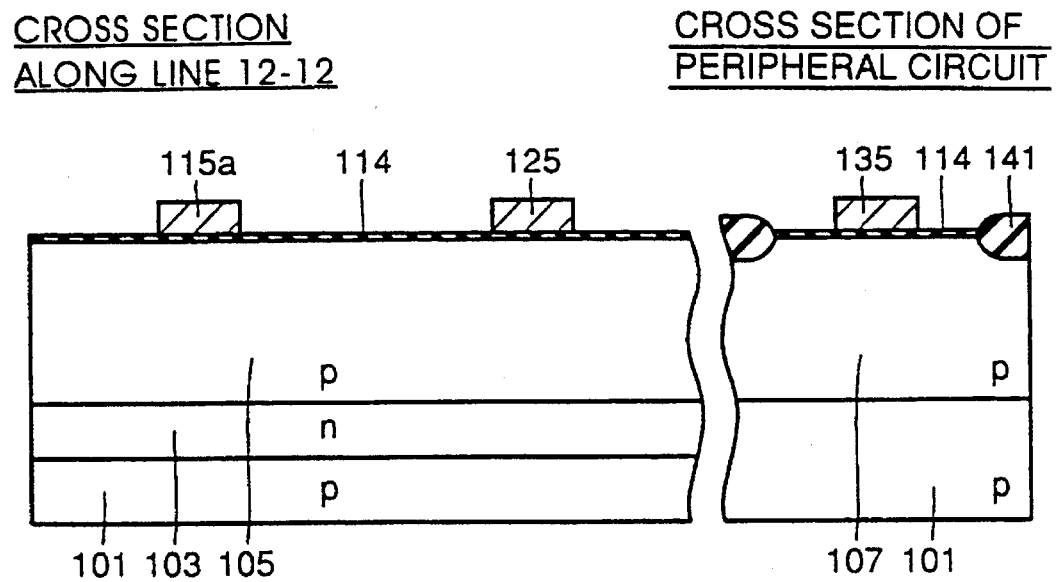

Referring to FIG. 19, gate electrode layers 115a, 125 and 135 of intended shapes are formed based on the usual photolithographic process and etching process.

Subsequently, source/drain regions are formed by impurity ion implantation or the like, and the structure shown in FIG. 12 is completed.

Finally, resistors and bit lines are formed to complete the SRAM-type memory cell and peripheral circuit.

Figure 20:
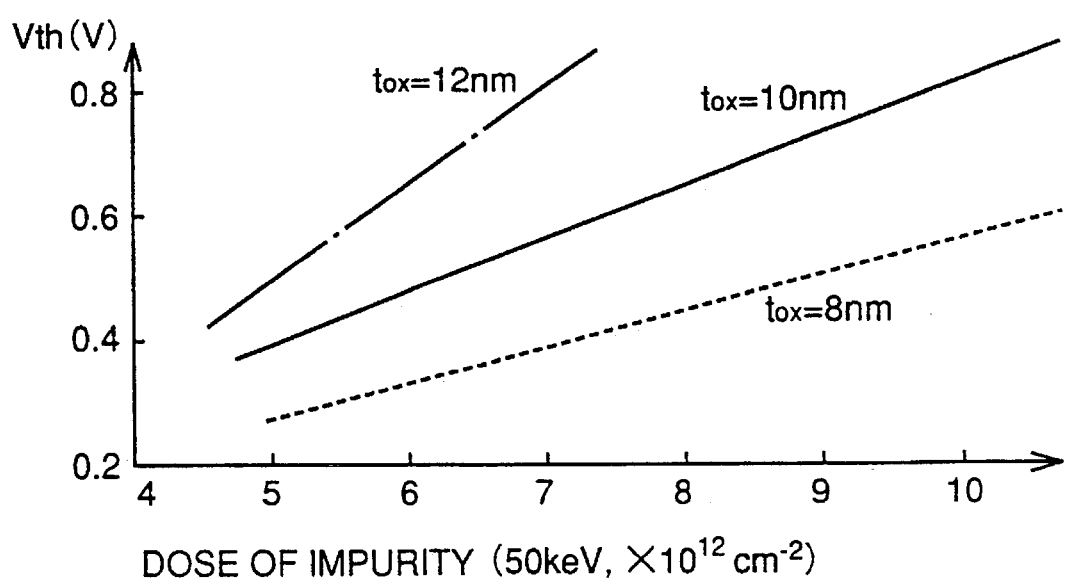
FIG. 20 is a graph showing the relationship between the quantity of doping of boron at 50 keV in the gate oxide film and the threshold voltage of the transistor.

In the foregoing steps of fabrication process, the dose of p-type impurity and the doping energy level are determined for a 10-nm thickness of gate oxide film so that the channel regions of the transistors 110, 120 and 130 have the prescribed surface concentrations of impurity mentioned above. These surface concentrations of impurity can be determined arbitrarily based on the graph of FIG. 20. With a thickness of gate oxide film being selected from among 8 nm, 10 nm and 12 nm, for example, the dose of impurity is determined from an intended threshold voltage on the graph.

In the semiconductor memory device of this embodiment, the p-wells 105 and 107 of the memory cell area and peripheral circuit area are connected electrically, and accordingly the same effectiveness as the Embodiment 1 is attained.

In the semiconductor memory device of this embodiment, the driver transistor has the higher threshold voltage than that of the access transistor, and the access transistor has the higher threshold voltage than that of the peripheral transistor. Consequently, it: (1) retains data more stably, (2) reads data out of memory cell more stably, (3) operates faster, and (4) prevents data inversion of memory cell. These matters will be explained in more detail.

(1) Stabilization of data retention

Figure 21:
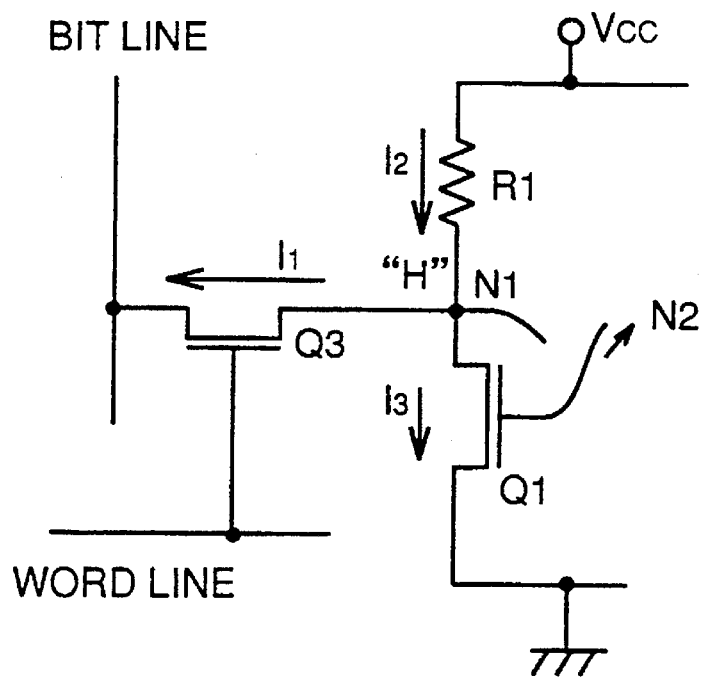
FIG. 21 is a diagram of the partial equivalent circuit of the SRAM-type memory cell.

Referring to FIG. 21, in order for the SRAM-type memory cell to retain data, a current I3 flowing through the cutoff driver transistor Q1 must be smaller than a current I2 flowing through the high-resistance load resistor R1. Otherwise, if current I3 is greater than current I2, the voltage on the memory node N1 will fall close on the GND voltage and it will be indistinguishable from the "low" level of the other memory node N2.

Figure 22:
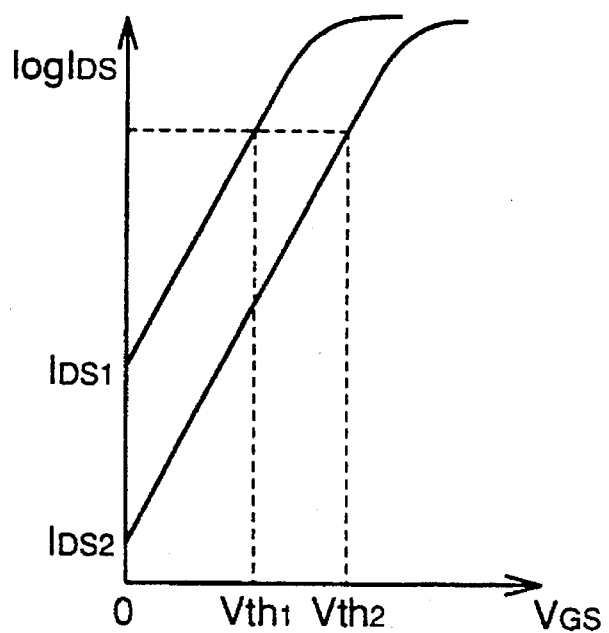
FIG. 22 is a graph showing the subthreshold characteristics.

This embodiment, in which the driver transistor Q1 has the highest threshold voltage relative to other transistors, can make the source-drain current $I_{DS}$ ($I_3$) of driver transistor Q1 smaller based on the subthreshold characteristics shown in FIG. 22. Namely, when the threshold voltage is increased from $V_{th1}$ to $V_{th2}$, the source-drain current decreases from $I_{DS1}$ to $I_{DS2}$ as shown. Accordingly, by setting the threshold voltage of the driver transistor Q1 highest, the current I3 flowing through driver transistor Q1 decreases. Consequently, the voltage of the memory node N1 is retained, and the stability of data retention is improved.

(2) Stabilization of memory cell readout operation

Figure 23A:
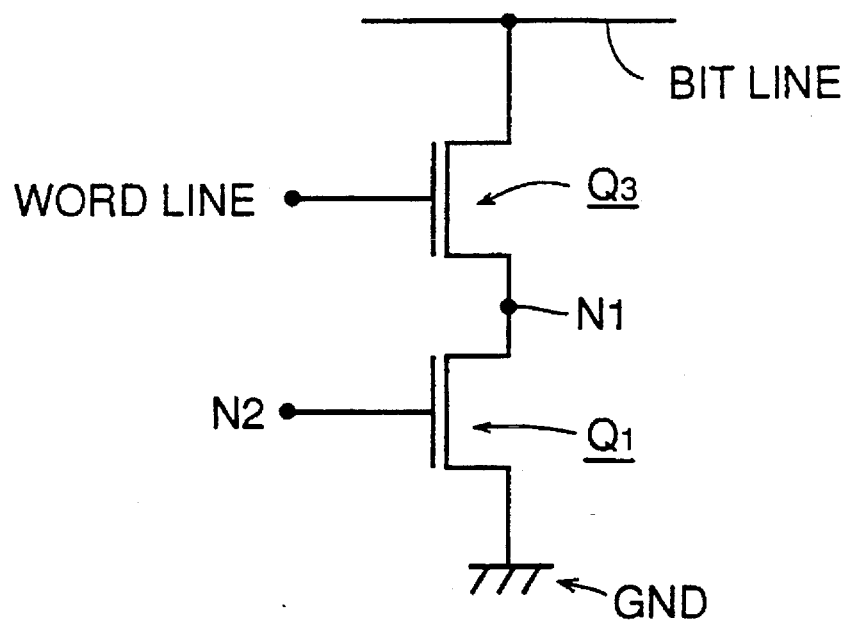
FIGS. 23A and 23B are diagrams of equivalent circuit used to explain the data readout operation of the SRAM-type memory cell.
Figure 23B:
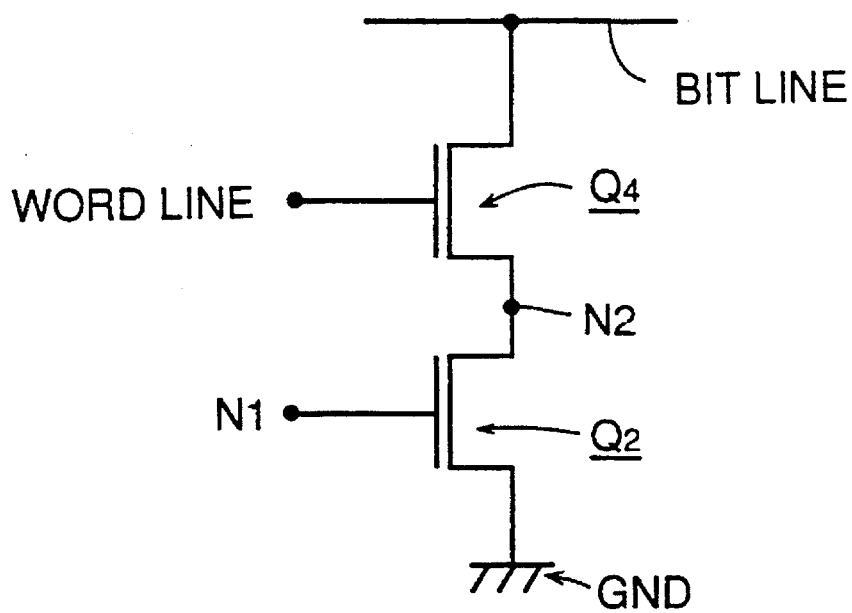

Referring to FIGS. 23A and 23B, the memory cell readout characteristics are evaluated by varying the gate voltage of one driver transistor (memory node voltage of the other driver transistor), with its bit line and word line being pulled to Vcc, and measuring the voltage variation of its memory node.

Figure 24:
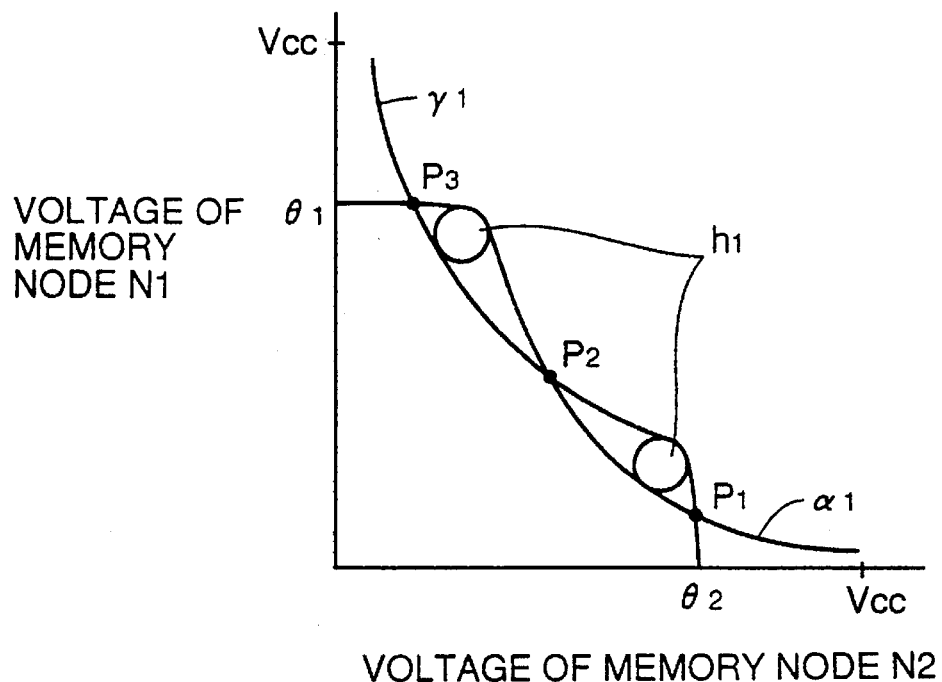
FIG. 24 is a graph showing data readout characteristic curves of the SRAM-type memory cell.

FIG. 24 is a graph relating the voltage of memory node N1 on the vertical axis to the voltage of memory node N2 on the horizontal axis. Curve $\alpha_1$ shows the voltage variation of N1 in response to the voltage variation of N2, and curve $\gamma_1$ shows the voltage variation of N2 in response to the voltage variation of N1.

These curves $\alpha_1$ and $\gamma_1$ intersect at three points $P_1$, $P_2$ and $P_3$. The point $P_3$ is the state when the memory node N1 retains "high" level, and the point $P_1$ is the state when the memory node N2 retains "high" level. The point $P_2$ is an unstable transitional point during the readout operation. Areas defined by circles $h^1$ are called "eyes" of memory cell. The larger the memory cell eye, the more stable is the readout operation, in general. The memory cell eye is described in publications EVERT SEEVINCK et al., IEEE JOURNAL OF SOLID-STATE CIRCUITS, Vol.SC-22, No. 5, Oct. 1987, pp.748–754, and H.Shinohara et al., VLSI'82, pp. 106–107.

A method of expanding the memory cell eye to enhance the stability of readout operation is to lower the threshold voltage Vth of access transistor. The access transistors Q3 and Q4 have their threshold voltages $V_{th}$ corresponding to values Vcc-$\theta_1$ and Vcc-$\theta_2$, respectively, on the graph of FIG. 24.

Figure 25:
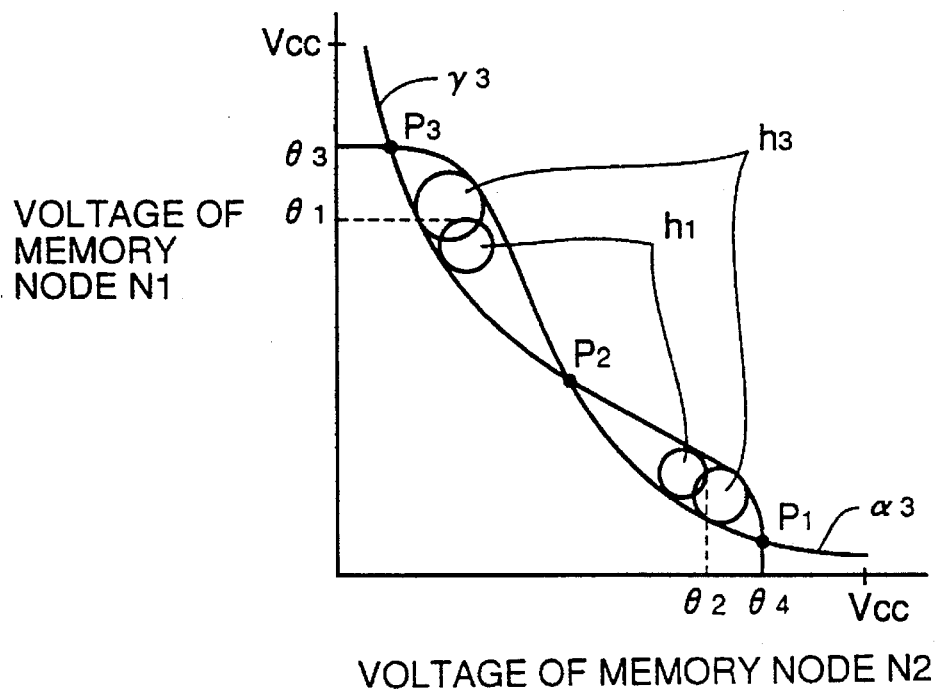
FIG. 25 is a graph showing data readout characteristic curves of the case of the access transistor having a lower threshold voltage.

When the threshold voltages $V_{th}$ of Q3 and Q4 are reduced to Vcc-$\theta_3$ and Vcc-$\theta_4$, respectively, as shown in FIG. 25, the memory cell eyes expand from circles $h_1$ to $h_3$.

The semiconductor memory device of this embodiment is designed to have the threshold voltage of access transistor set lower than that of driver transistor, and consequently the readout operation is stabilized.

(3) Speed-up of operation

A factor effective on the operational speed of the semiconductor memory device is the current driving ability $I_{DS}$ of nMOS transistors of the peripheral circuit. Since $I_{DS}$ is virtually proportional to $(V_{GS}-V_{th})^n$ (where n is a value ranging 1–2, and $V_{GS}$ is the voltage applied between the gate and source), it is effective to set the threshold voltage $V_{th}$ lower for increasing the $I_{DS}$.

The semiconductor memory device of this embodiment is designed to have the threshold voltage of peripheral transistor set lowest among the transistors. Accordingly, the peripheral transistor can have a large current driving ability $I_{DS}$, and the operation is sped up.

(4) Prevention of data inversion

Although it is desirable for the access transistor to have a low threshold voltage from the viewpoint of stable readout operation as mentioned in item (2), when it is made as low as the threshold voltage of peripheral transistor mentioned in item (3), soft error, i.e., inversion of data in the memory cell, becomes liable to emerge. This matter will be explained in detail.

Referring to FIG. 21, when the threshold voltage of the access transistor is lowered thereby to increase its current driving ability $I_{DS}$, the current $I_1$ flowing through the cutoff access transistor Q3 will increase due to the subthreshold characteristics shown in FIG. 22. If this current $I_1$ exceeds the current $I_2$ flowing through the load resistor R1, the voltage of the memory node N1 falls to a level lower than the voltage of the other memory node N2. This is as if the memory node N1 is "low" and the other memory node N2 is "high", and inversion of data takes place.

The semiconductor memory device of this embodiment is designed to have the threshold voltage of access transistor set higher than that of peripheral transistor. Consequently, the current $I_1$ of access transistor Q3 is smaller than the current $I_2$ of load resistor R1, and the occurrence of soft error is prevented.

For the achievement of all effects of items (1) through (4), the threshold voltages are preferably set to be: 0.65 V or higher for the driver transistor, 0.50 V or higher and below 0.65 V for the access transistor, and below 0.50 V for the peripheral transistor.

More preferably, the threshold voltages are set to be: 0.80 V or higher for the driver transistor, 0.55 V or higher and below 0.65 V for the access transistor, and at most 0.40 V for the peripheral transistor.

Based on the prescribed settings of threshold voltages, SRAM-type memory cells, even with a low power voltage rating of 3.3 V, operate stably and fast.

The method of fabricating the semiconductor memory device based on this embodiment attains the same effectiveness as the first embodiment.

Although the foregoing first and second embodiments deal with p-type semiconductor substrates, an n-type semiconductor substrate can also be used, as will be explained in the following embodiment.

Embodiment 3

Figure 26:
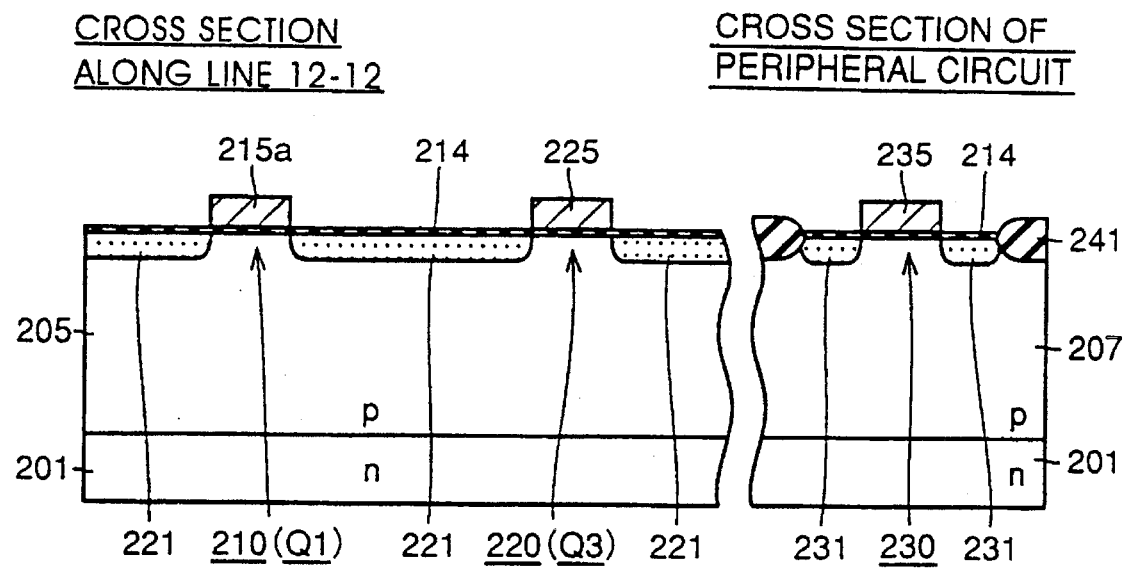
FIG. 26 is a cross-sectional diagram showing briefly the structure of the semiconductor memory device based on the third embodiment of this invention.

Referring to FIG. 26, p-wells 205 and 207 are formed selectively in the memory cell area and peripheral circuit area, respectively, at an n-type semiconductor substrate 201. At the p-well 205 of memory cell area, a driver transistor 210 and access transistor 220 are formed. At the p-well 207 of peripheral circuit area, a peripheral transistor 230 which is an nMOS transistor is formed.

The driver transistor 210 has its threshold voltage set higher than that of the access transistor 220, and the threshold voltage of the access transistor 220 is set higher than that of the peripheral transistor 230. The p-wells 205 and 207 of the memory cell area and peripheral circuit area have the same voltage level.

The structure of the transistors 210, 220 and 230 have virtually the same structure as the transistors 110, 120 and 130 of the second embodiment, and explanation thereof is omitted.

The method of fabricating the semiconductor memory device based on this embodiment will be explained.

Figure 27:
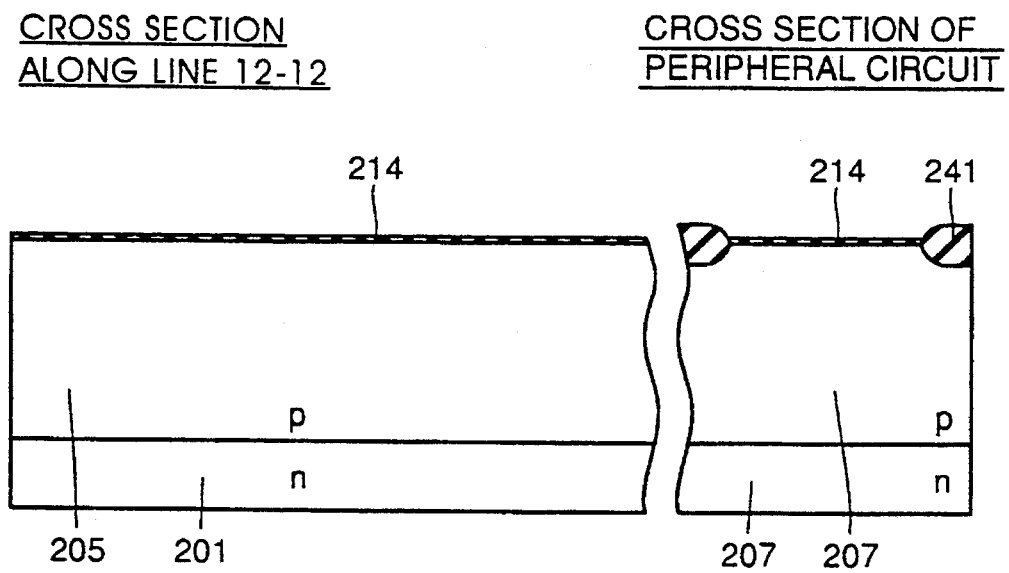
FIG. 27 through FIG. 31 are cross-sectional diagrams showing briefly the sequential steps of the fabrication method of semiconductor memory device based on the third embodiment of this invention.

Referring to FIG. 27, at an n-type semiconductor substrate 201, p-wells 205 and 207 are formed selectively in intended portions of the memory cell area and peripheral circuit area. Subsequently, a separation insulating layer 241 is formed selectively based on the usual LOCOS process or the like. On the surface of the p-wells 205 and 207, an oxide films 214 which will become gate oxide films is formed.

Figure 28:
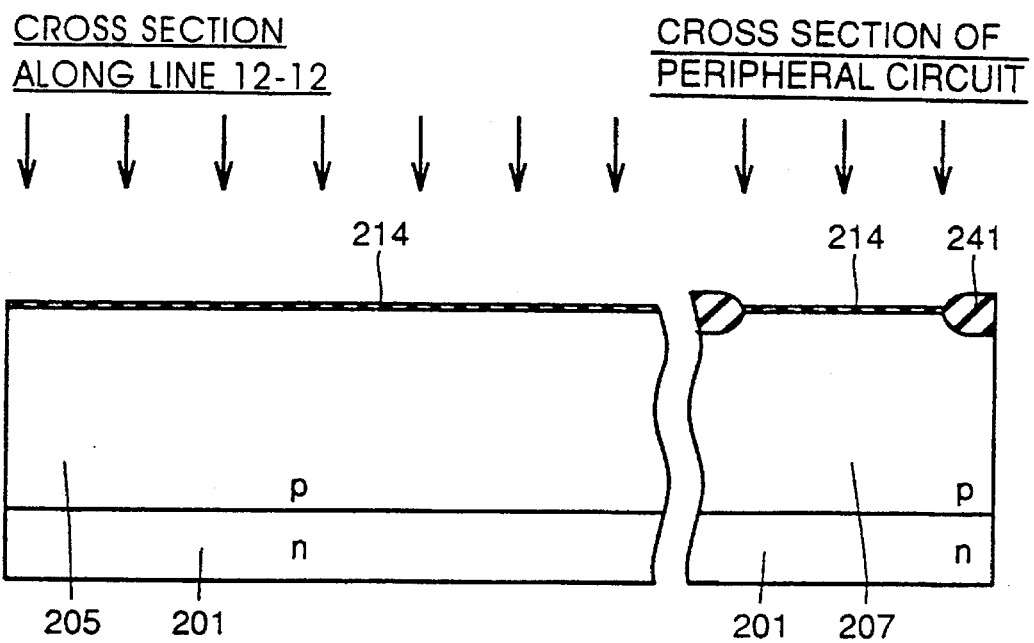

Referring to FIG. 28, p-type impurity such as boron is doped in intended portions of the memory cell area and peripheral circuit area for a dose of $5.0–10^{12} \text{cm}^{-2}$ at 50 keV.

Figure 29:
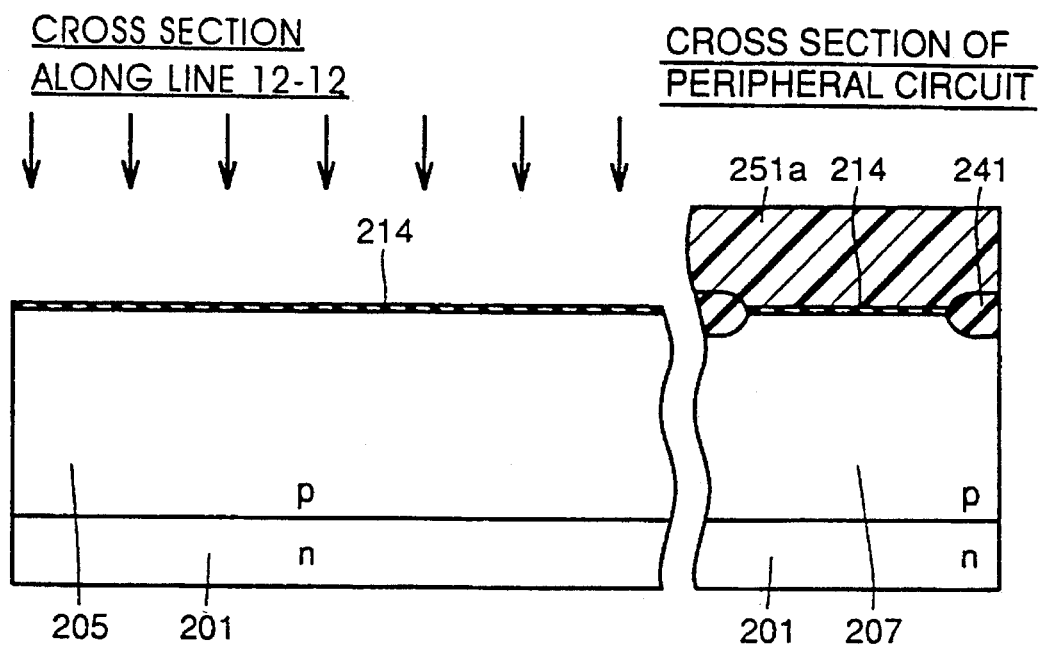

Referring to FIG. 29, a resist pattern 251a is formed in the peripheral circuit area based on the usual photolithographic process. By using the resist pattern 251a as a mask, p-type impurity such as boron is doped to the surface of the memory cell area for a dose of $3.0 \times 10^{12} \text{cm}^{-2}$ at 50 keV. The resist pattern 251a is removed thereafter.

Figure 30:
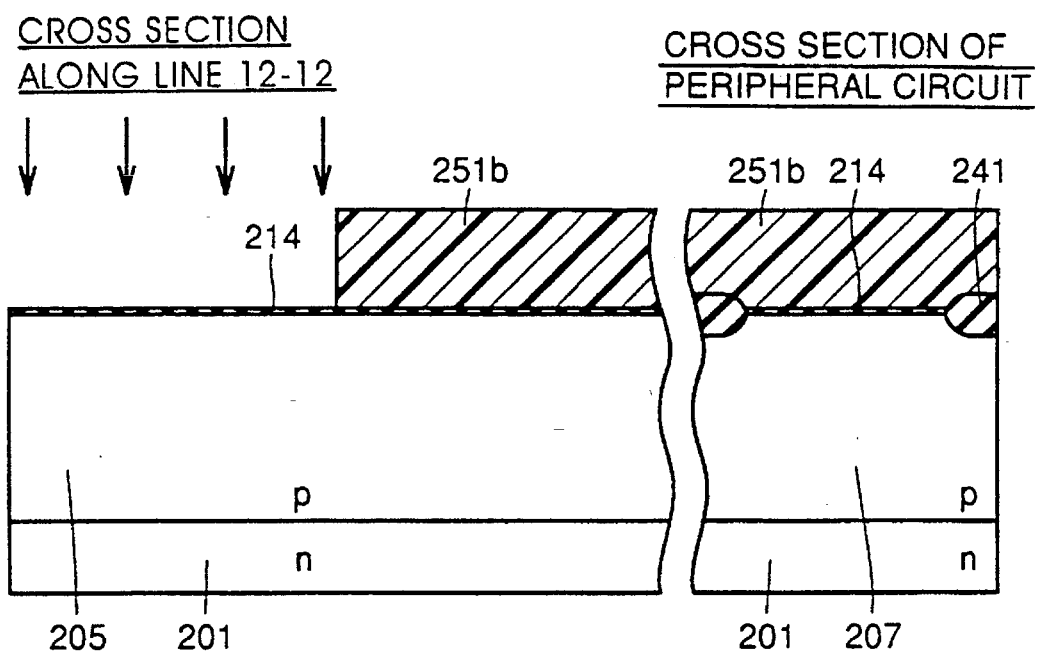

Referring to FIG. 30, a resist pattern 251b is formed in the area where the access transistor will be formed and in the peripheral circuit area based on the usual photolithographic process. By using the resist pattern 251b as a mask, p-type impurity such as boron is doped in the surface area where the driver transistor will be formed for a dose of $3.0 \times 10^{12} \text{cm}^{-2}$ at 50 keV. The resist pattern 251b is removed thereafter.

Figure 31:
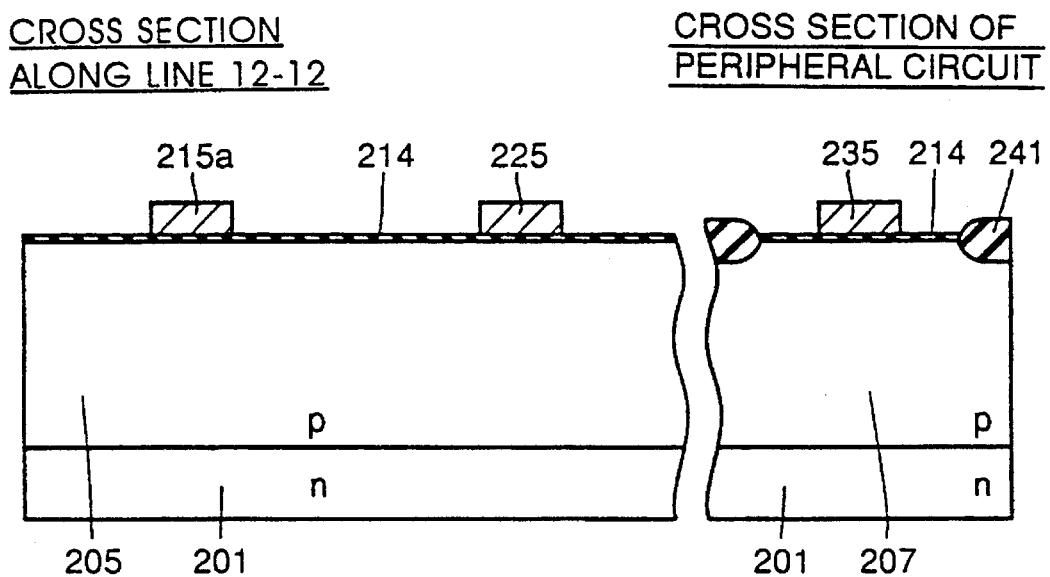

Referring to FIG. 31, gate electrode layers 215a, 225 and 235 of intended shapes are formed. Subsequently, source/drain regions are formed by ion implantation or the like, and the structure shown in FIG. 26 is completed.

Finally, resistors and bit lines are formed to complete the SRAM device.

The semiconductor memory device of this embodiment is designed to have the same voltage level of the p-wells 205 and 207 of the memory cell area and peripheral circuit area. Consequently, it attains the same effectiveness as the Embodiment 1.

In the semiconductor memory device of this embodiment, the driver transistor has a higher threshold voltage than that of the access transistor, and the threshold voltage of the access transistor is higher than that of the period transistor. Consequently, the effects of items (1) through (4) explained in connection with the second embodiment are attained.

Doping of impurity for determining the threshold voltage may be carried out in arbitrary order of process, instead of the order of process of this embodiment, as will be explained in the following embodiment.

Embodiment 4

The fabrication method of this embodiment follows the steps of process of the Embodiment 3 shown in FIG. 27 and FIG. 28.

Figure 32:
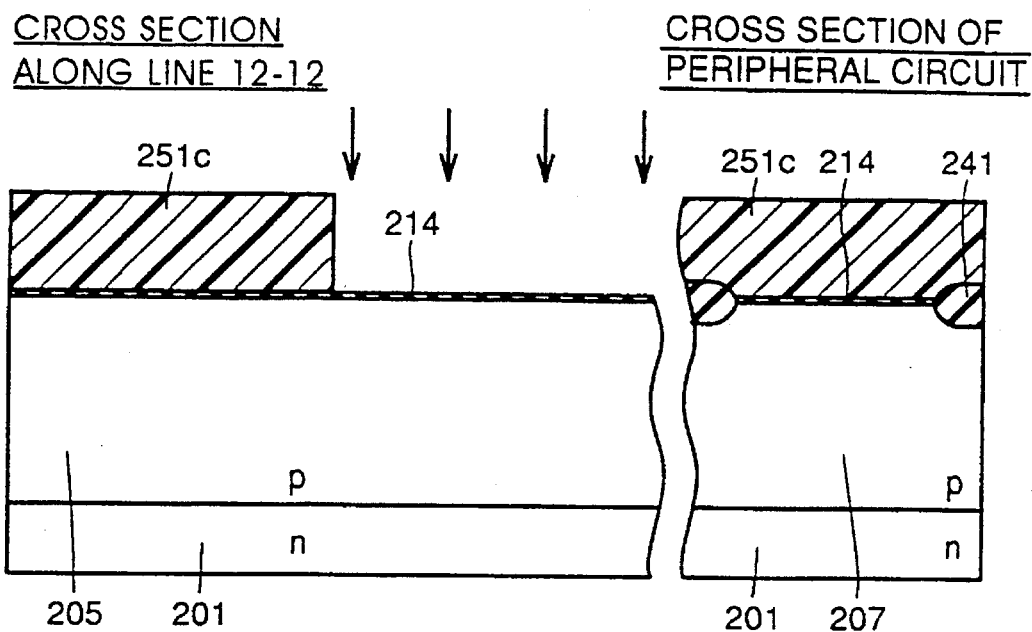
FIG. 32 and FIG. 33 are cross-sectional diagrams showing briefly the sequential steps of the fabrication method of semiconductor memory device based on the fourth embodiment of this invention.

Referring to FIG. 32, subsequently a resist pattern 251c is formed in the area where the driver transistor will be formed and in the peripheral circuit area based on the usual photolithographic process. By using the resist pattern 251c as a mask, p-type impurity such as boron is doped in the surface area where the access transistor will be formed for a dose of $3.0 \times 10^{12} \text{cm}^{-2}$ at 50 keV. The resist pattern 251c is removed thereafter.

Figure 33:
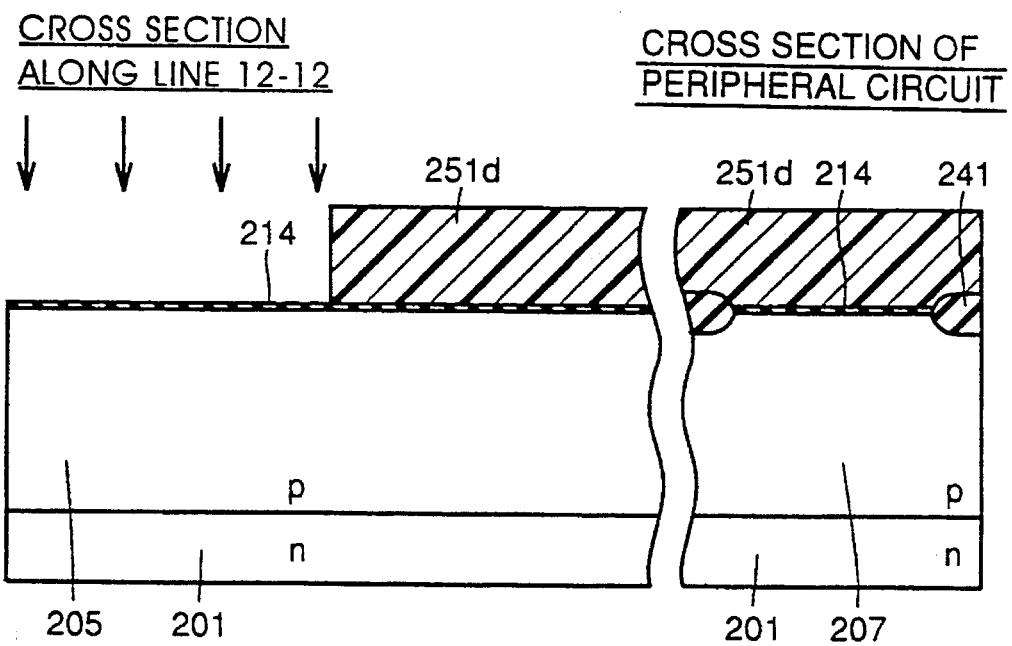
Figure 34:
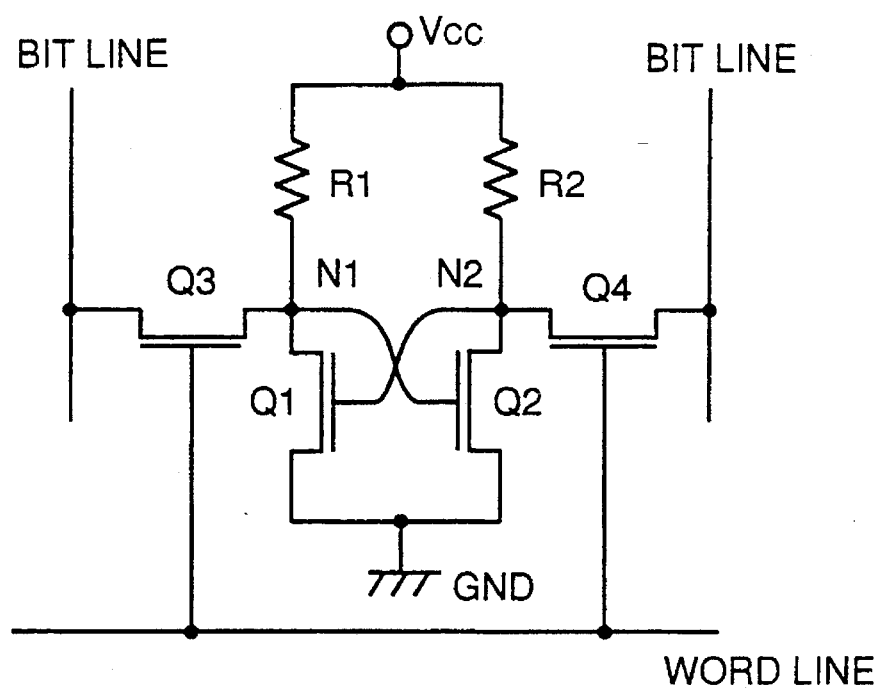
FIG. 34 is a diagram of equivalent circuit of a typical SRAM-type memory cell.

Referring to FIG. 33, a resist pattern 251d is formed in the memory cell area where the access transistor will be formed and in the peripheral circuit area based on the usual photolithographic process. By using the resist pattern 251d as a mask, p-type impurity such as boron is doped in the surface area where the driver transistor will be formed for a dose of $6.0 \times 10^{12} \text{cm}_{-2}$ at 50 keV. The resist pattern 251d is removed thereafter.

Finally, the same step of process of the third embodiment shown in FIG. 31 is carried out to complete the SRAM device.

In the semiconductor memory device of this embodiment, the driver transistor has a higher threshold voltage than that of the access transistor, and the threshold voltage of the access transistor is higher than that of the peripheral transistor. Consequently, the effects of items (1) through (4) explained in connection with the second embodiment are attained.

Although in the foregoing embodiments, the driver transistor, access transistor and peripheral transistor are all MOS transistors, the present invention is not confined to this type of transistor, but the invention is applicable to any kind of MIS (Metal Insulator Semiconductor) transistor.

Although in the foregoing embodiments, impurity doped in the channel regions as the determinant of the threshold voltages are boron, the present invention is not confined to this material, but any kind of impurity having a conductivity type opposite to the source/drain region can be used. The dose and doping energy are set appropriately depending on the kind of impurity. The impurity concentration on the surface of the channel region is also set depending on the kind of impurity.

Although in the first embodiment shown in FIG. 6, the p-wells 5 and 7 are connected electrically by the conductor layer 45, other manner of connection may be employed.

In the semiconductor memory device according to one aspect of this invention, the impurity concentration of the second impurity region near the surface is set higher than that of the third impurity region. Consequently, the first MIS transistor of memory cell has a higher threshold voltage than that of the second MIS transistor in the peripheral circuit area. Accordingly, it does not need to have a bias voltage generation circuit used in the conventional semiconductor memory device, and the chip size is reduced and the power consumption is also reduced.

The elimination of the bias voltage generation circuit enables the second and third impurity regions to have the same voltage level by being connected electrically. Consequently, the voltage applied to the gate insulating layer of the first MIS transistor can be lowered as compared with the conventional device, and the decay of gate insulating layer is suppressed significantly.

In the semiconductor memory device according to another aspect of this invention, the driver transistor has a higher threshold voltage than that of the access transistor, and the threshold voltage of the access transistor is higher than that of the nMOS transistor of the peripheral circuit. Consequently, the SRAM-type memory cell has enhanced stability of data retention, the occurrence of soft error is prevented, the readout operation is stabilized, and the operation is sped up.

In the method of fabricating the semiconductor memory device according to this invention, the same mask of resist pattern is used in the steps of forming the first impurity region in the memory cell area and doping impurity for determining the threshold voltage of transistor. Consequently, it is possible to make the threshold voltage of the memory cell transistor higher than that of the peripheral circuit transistor without increasing the number of steps of photolithographic process relative to the conventional method.

Moreover, the steps of forming the substrate bias voltage generation circuit in the conventional method are eliminated, and the fabrication process is simplified.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a memory cell area including static-type memory cells, and a peripheral circuit area, said device comprising:

a semiconductor substrate of a first conductivity type having a major surface;

a first impurity region of a second conductivity type formed within said memory cell area at the major surface of said semiconductor substrate;

a second impurity region of the first conductivity type which is formed within said first impurity region at the major surface of said semiconductor substrate and includes impurity of the first conductivity type at a first concentration at a position near the major surface of said semiconductor substrate;

first MIS transistors each having a pair of source/drain regions formed by being spaced out from each other by a prescribed distance within said second impurity region at the major surface of said semiconductor substrate, and a gate electrode layer formed on the area between said source/drain regions by being interposed with a gate insulating layer;

a third impurity region of the first conductivity type which is formed within said peripheral circuit area at the major surface of said semiconductor substrate and includes impurity of the first conductivity type at a second concentration which is lower than said first concentration at a position near the major surface of said semiconductor substrate; and a second MIS transistor having a pair of source/drain regions formed by being spaced out from each other by a prescribed distance within said third impurity region at the major surface of said semiconductor substrate, and a gate electrode layer formed on the area between said source/drain regions by being interposed with a gate insulating layer, said second and third impurity regions being connected electrically.

2. A semiconductor memory device according to claim 1, wherein said first MIS transistors include an access transistor and driver transistor which constitute said memory cell, the threshold voltage of said driver transistor being higher than the threshold voltage of said access transistor, the threshold voltage of said access transistor being higher than the threshold voltage of said second MIS transistor.

3. A semiconductor memory device according to claim 2, wherein said driver transistor has a threshold voltage of 0.65 V or higher, said access transistor has a threshold voltage of 0.50 V or higher and below 0.65 V, and said second MIS transistor has a threshold voltage below 0.50 V.

4. A semiconductor memory device according to claim 3, wherein impurity of the first conductivity type in the area between the source/drain regions of said driver transistor has a concentration of $2.4 \times 10^{16}$ cm$^{-3}$ or more at a position near the major substrate surface, impurity of the first conductivity type in the area between the source/drain regions of said access transistor has a concentration of $1.8 \times 10^{16}$ cm$^3$ or more and below $2.4 \times 10^{16}$ cm$^{-3}$ at a position near the major substrate surface, and impurity of the second conductivity type in the area between the source/drain regions of said second MIS transistor has a concentration below $1.8 \times 10^{16}$ cm$^{-3}$.

5. A semiconductor memory device according to claim 1 further including:

an insulating layer which is formed on said first and second MIS transistors and has holes which reach the surface of said second and third impurity regions; and a conductive layer which connects said second and third impurity regions electrically by way of said holes.

* * * * *